(12) United States Patent
Tseng et al.

(10) Patent No.: US 9,875,805 B2
(45) Date of Patent: Jan. 23, 2018

(54) DOUBLE LOCKOUT IN NON-VOLATILE MEMORY

(71) Applicant: SanDisk Technologies Inc., Plano, TX (US)

(72) Inventors: Huai-Yuan Tseng, San Ramon, CA (US); Deepanshu Dutta, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/928,860

(22) Filed: Oct. 30, 2015

(65) Prior Publication Data

US 2016/0217869 A1 Jul. 28, 2016

Related U.S. Application Data

(60) Provisional application No. 62/107,057, filed on Jan. 23, 2015.

(51) Int. Cl.
| | |
|---|---|
| *G11C 16/34* | (2006.01) |
| *G11C 16/10* | (2006.01) |
| *G11C 11/56* | (2006.01) |
| *G11C 16/32* | (2006.01) |

(52) U.S. Cl.
CPC ...... *G11C 16/3459* (2013.01); *G11C 11/5628* (2013.01); *G11C 16/10* (2013.01); *G11C 16/32* (2013.01); *G11C 2211/5621* (2013.01)

(58) Field of Classification Search
CPC .. G11C 16/3459; G11C 11/5628; G11C 16/10
See application file for complete search history.

(56) References Cited

U.S. PATENT DOCUMENTS

| | | | |
|---|---|---|---|
| 5,339,274 A | 8/1994 | Dhong et al. | |
| 6,141,244 A | 10/2000 | Pawletko et al. | |
| 6,643,188 B2 | 11/2003 | Tanaka et al. | |
| 6,888,758 B1 * | 5/2005 | Hemink | G11C 11/5628 365/185.18 |
| 7,020,026 B2 | 3/2006 | Guterman et al. | |
| 7,073,103 B2 | 7/2006 | Gongwer et al. | |

(Continued)

OTHER PUBLICATIONS

U.S. Appl. No. 14/841,182, filed Aug. 31, 2015.

*Primary Examiner* — Douglas King
(74) *Attorney, Agent, or Firm* — Vierra Magen Marcus LLP

(57) ABSTRACT

A double lockout programming technique is provided having a hidden delay between programming and verification. A temporary lockout stage and a permanent lockout stage are provided for double lockout programming. The temporary lockout stage precedes the permanent lockout stage and is used to initially determine when a memory cell should be locked out a first time for one or more program pulses. When a memory cell initially passes verification for its target state, it is temporarily locked out from programming for one or more program pulses. The memory cell enters a permanent lockout stage where it is verified again for its target state. When the memory cell passes verification a second time, it is permanently locked out for programming during the current program phase. The memory cell may be programmed at one or more reduced program rates in the permanent lockout stage.

20 Claims, 22 Drawing Sheets

(56) References Cited

U.S. PATENT DOCUMENTS

| | | |
|---|---|---|
| 7,139,198 B2 | 11/2006 | Guterman et al. |
| 7,257,028 B2 | 8/2007 | Lee et al. |
| 7,307,887 B2 | 12/2007 | Chen |
| 7,310,255 B2 | 12/2007 | Chan |
| 7,454,324 B1 | 11/2008 | Seawright et al. |
| 7,471,567 B1 | 12/2008 | Lee et al. |
| 7,508,715 B2 | 3/2009 | Lee |
| 7,551,477 B2 | 6/2009 | Mokhlesi et al. |
| 7,616,500 B2 | 11/2009 | Mokhlesi |
| 7,800,094 B2 | 9/2010 | Ho et al. |
| 7,800,948 B2 | 9/2010 | Cernea |
| 7,826,271 B2 | 11/2010 | Cernea |
| 8,218,381 B2 | 7/2012 | Li |
| 8,223,556 B2 | 7/2012 | Dutta et al. |
| 8,582,381 B2 | 11/2013 | Oowada et al. |
| 8,885,416 B2 | 11/2014 | Mui et al. |
| 8,902,668 B1* | 12/2014 | Dutta ................ G11C 16/3459 365/185.02 |
| 9,165,659 B1* | 10/2015 | Pang .................... G11C 16/10 |
| 2004/0109362 A1 | 6/2004 | Gongwer et al. |
| 2007/0153594 A1* | 7/2007 | Chen ................... G11C 11/5628 365/195 |
| 2008/0158955 A1* | 7/2008 | Lee .................... G11C 11/5628 365/185.03 |
| 2008/0247254 A1 | 10/2008 | Nguyen et al. |
| 2009/0010068 A1* | 1/2009 | Lee .................... G11C 11/5628 365/185.19 |
| 2009/0237993 A1* | 9/2009 | Yanagidaira ........ G11C 11/5628 365/185.03 |
| 2011/0069556 A1* | 3/2011 | Higashi ............... G11C 11/5628 365/185.22 |
| 2012/0014184 A1* | 1/2012 | Dutta .................. G11C 11/5628 365/185.19 |
| 2013/0094294 A1* | 4/2013 | Kwak ................. H01L 27/1157 365/185.03 |
| 2015/0103595 A1 | 4/2015 | Dunga et al. |
| 2015/0221391 A1 | 8/2015 | Tseng et al. |
| 2016/0055919 A1* | 2/2016 | Park ................... G11C 16/3459 365/185.12 |

\* cited by examiner

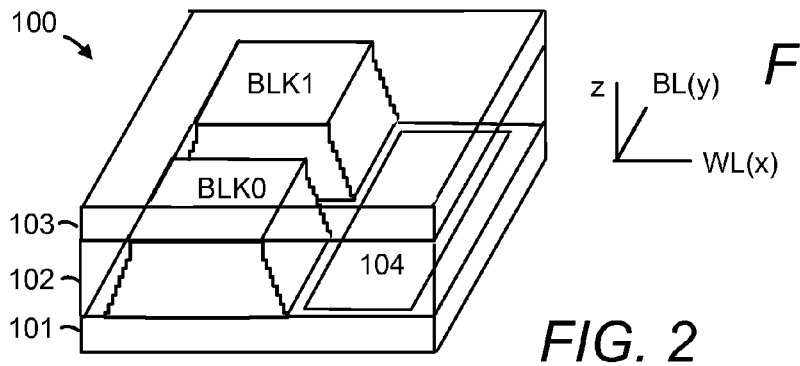
FIG. 1
FIG. 2
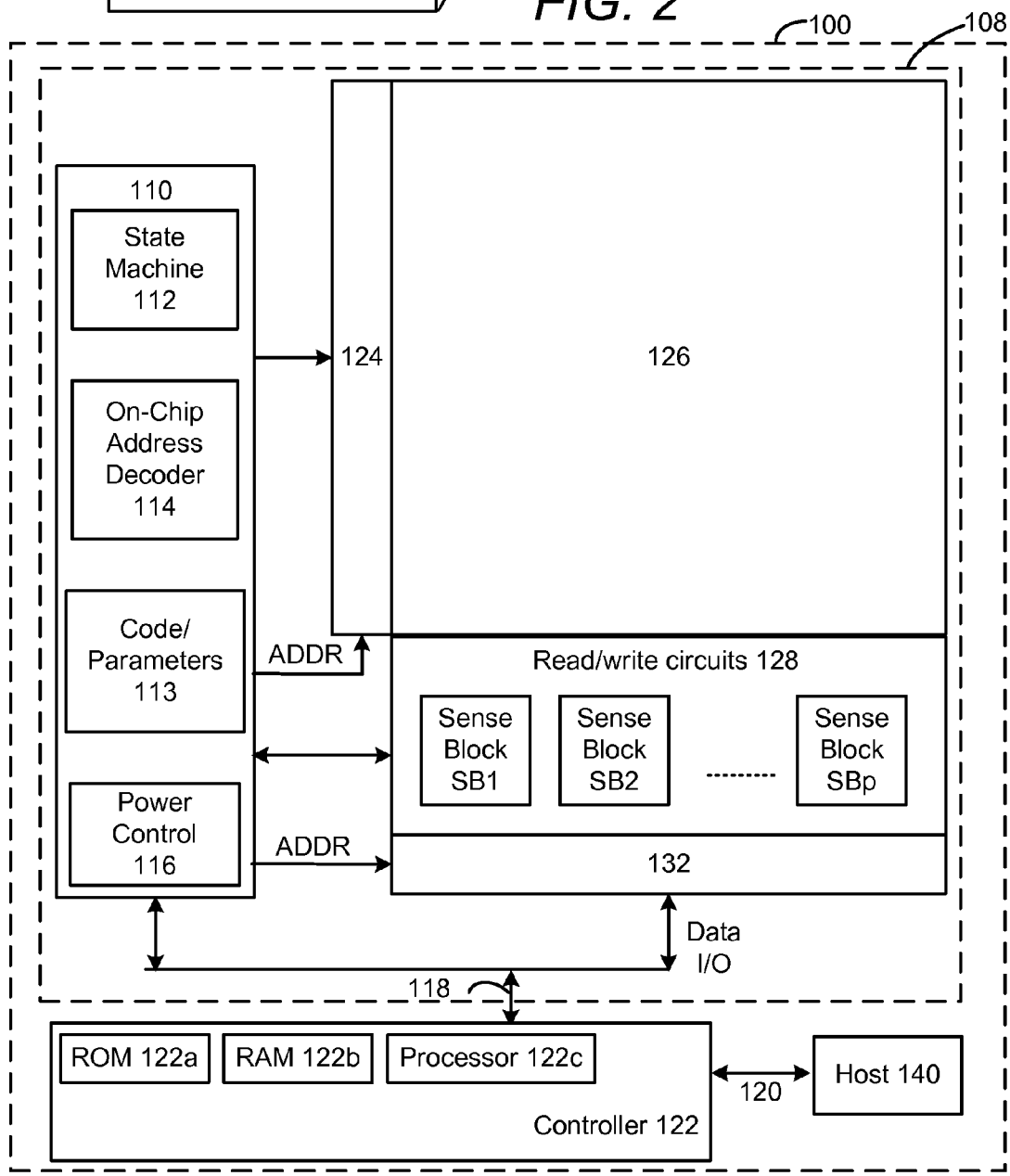

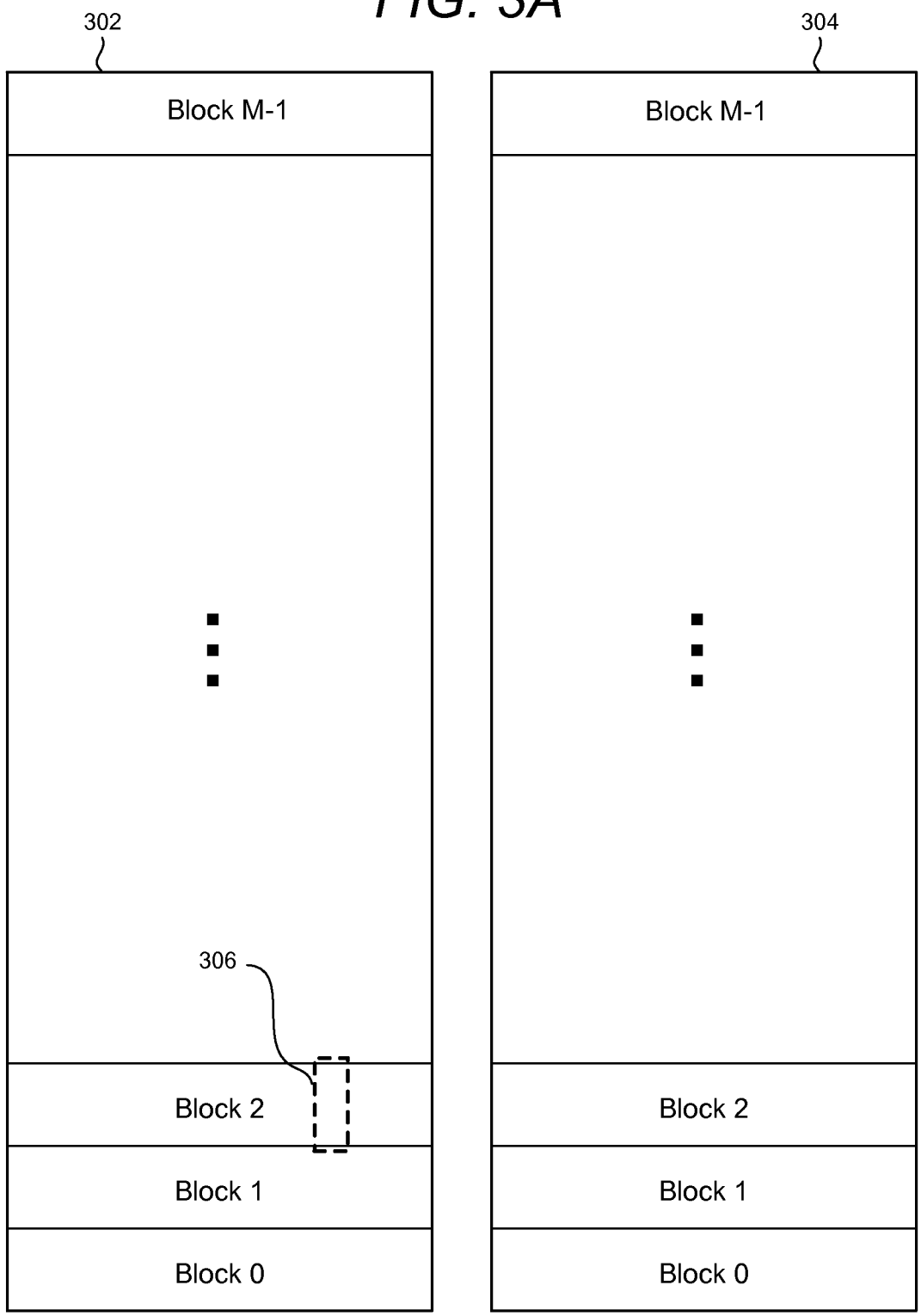

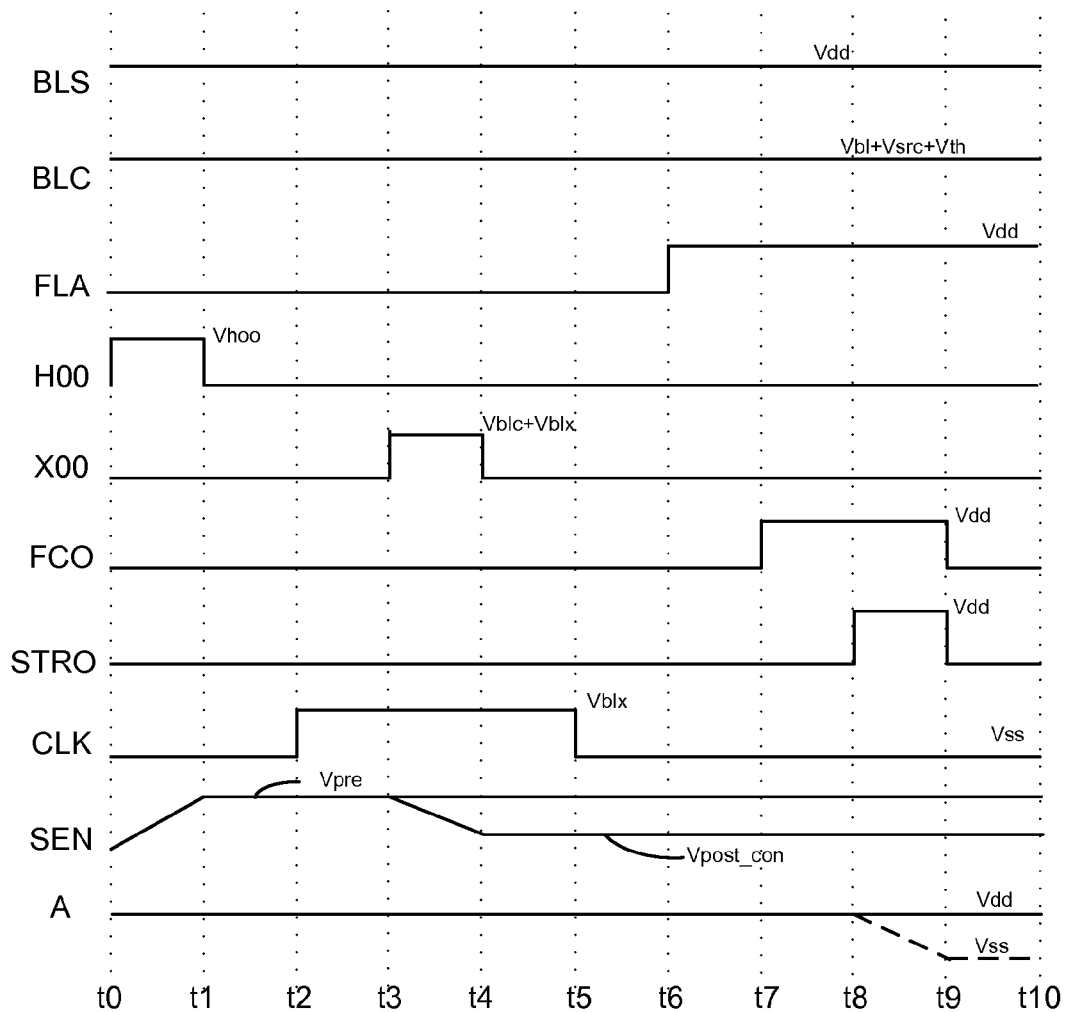
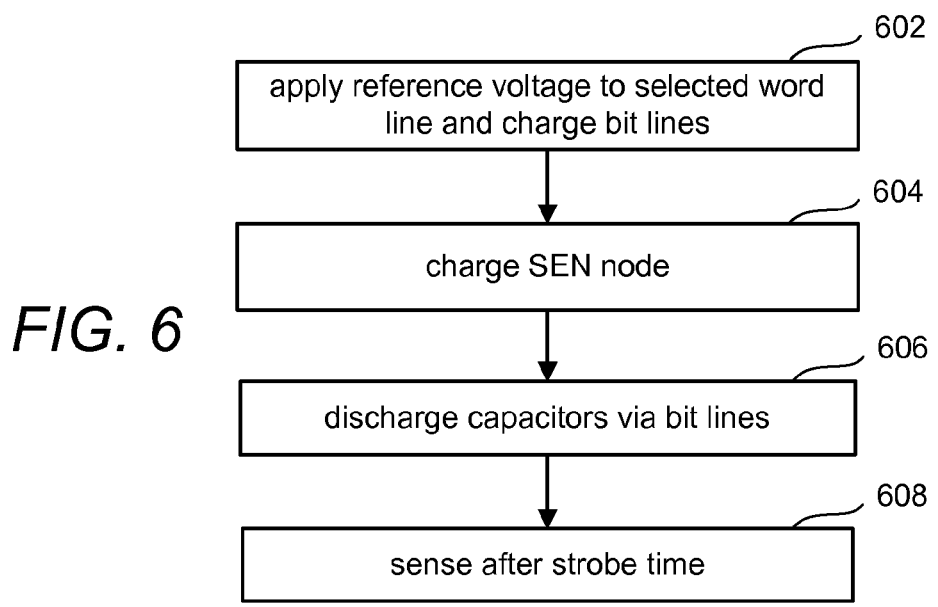

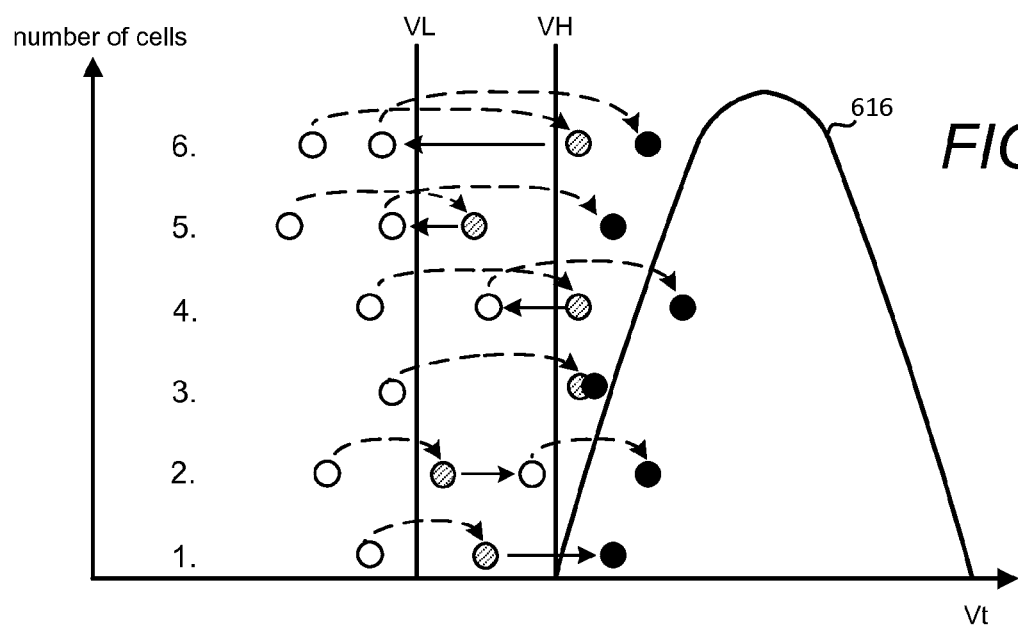
FIG. 15
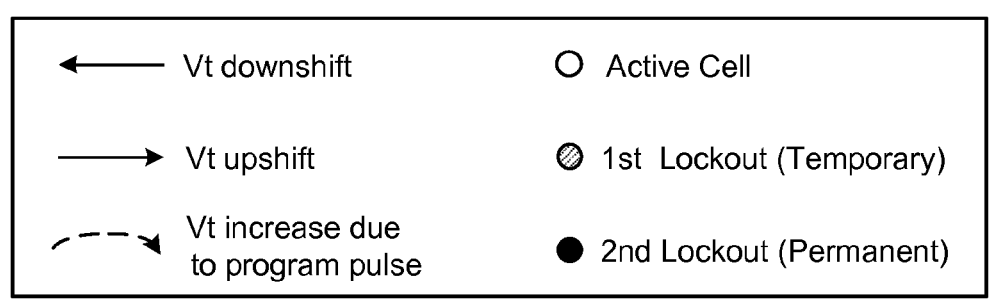

| Cell Type # | State | VL1 Status | VH1 Status | VL2 Status | VH2 Status | Treatment (VBLC) for Next Vpgm Pulse |
|---|---|---|---|---|---|---|
| 1 | A | FAIL | FAIL (Don't Care) | NOT AVAILABLE | NOT AVAILABLE | Venable1 (0.0V) |
| 2 | | PASS | FAIL | NOT AVAILABLE | NOT AVAILABLE | Vinhibit (2.5V) |
| 3 | | PASS | FAIL | FAIL | FAIL (Don't Care) | Venable2 (0.5V) |
| 4 | | PASS | FAIL | PASS | FAIL | Venable3 (1.0V) |
| 5 | | PASS | FAIL | PASS (Don't Care) | PASS | Vinhibit (2.5V) |
| 6 | | PASS | PASS | NOT AVAILABLE | NOT AVAILABLE | Vinhibit (2.5V) |
| 7 | | PASS | PASS | FAIL | FAIL (Don't Care) | Venable2 (0.5V) |
| 8 | | PASS | PASS | PASS | FAIL | Venable3 (1.0V) |
| 9 | | PASS | PASS | PASS Don't Care | PASS | Vinhibit (2.5V) |
| 10-63 | B-G | Same as A-State | | | | |
| 64 | Er | N/A | | | | Vinhibit |

FIG. 17

| | AL1 | AH1 | AL2 | AH2 | BL1 | BH1 | BL2 | BH2 | CL1 | CH1 | CL2 | CH2 | DL1 | DH1 | DL2 | DH2 | EL1 | EH1 | EL2 | EH2 | FL1 | FH1 | FL2 | FH2 | GL1 | GH1 | GL2 | GH2 | LO | Cases | Latch Req |
|---|---|---|---|---|---|---|---|---|---|---|---|---|---|---|---|---|---|---|---|---|---|---|---|---|---|---|---|---|---|---|---|
| No Lockout | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 29 | 5 |
| A Finished | | | | | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 25 | 5 |
| B Finished | | | | | | | | | 1 | 1 | 1 | 1 | 1 | 1 | 1 | 1 | 1 | 1 | 1 | 1 | 1 | 1 | 1 | 1 | 1 | 1 | 1 | 1 | 1 | 21 | 5 |
| C Finished | | | | | | | | | | | | | 1 | 1 | 1 | 1 | 1 | 1 | 1 | 1 | 1 | 1 | 1 | 1 | 1 | 1 | 1 | 1 | 1 | 17 | 5 |
| D Finished | | | | | | | | | | | | | | | | | 1 | 1 | 1 | 1 | 1 | 1 | 1 | 1 | 1 | 1 | 1 | 1 | 1 | 13 | 4 |
| E Finished | | | | | | | | | | | | | | | | | | | | | 1 | 1 | 1 | 1 | 1 | 1 | 1 | 1 | 1 | 9 | 4 |
| F Finished | | | | | | | | | | | | | | | | | | | | | | | | | 1 | 1 | 1 | 1 | 1 | 5 | 3 |
| G Finished | | | | | | | | | | | | | | | | | | | | | | | | | | | | | 1 | 1 | 1 |

FIG. 18

DOUBLE LOCKOUT IN NON-VOLATILE MEMORY

CLAIM OF PRIORITY

The present application claims priority from U.S. Provisional Patent Application No. 62/107,057, entitled "DOUBLE LOCKOUT MODE FOR PROGRAMMING," by Tseng et al., filed Jan. 23, 2015, incorporated by reference herein in its entirety.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which can correlate to a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer to create a vertical column of memory cells. Control gates of the memory cells are provided by the conductive layers. The threshold voltage (Vt) of the memory is controlled by the amount of charge that is retained in the charge-trapping material. That is, the minimum amount of voltage that must be applied to the control gate before the memory cell is turned on to permit conduction between its source and drain is controlled by the level of charge retained in the charge-trapping material. As such, the threshold voltage is used to an indicator of the data being stored by a memory cell.

Some non-volatile memory devices are used to store two ranges of charges and, therefore, the memory cell can be programmed/erased between two ranges of threshold voltages that correspond to two data states: an erased state (e.g., data "1") and a programmed state (e.g., data "0"). Such a device is referred to as a binary or two-state device.

A multi-state (or multi-level) non-volatile memory is implemented by identifying multiple, distinct allowed ranges of threshold voltages. Each distinct range of threshold voltages corresponds to a data state assigned a predetermined value for the set of data bits. The specific relationship between the data programmed into the memory cell and the ranges of threshold voltages depends upon the data encoding scheme adopted for the memory cells. For example, U.S. Pat. No. 6,222,762 and U.S. Patent Application Publication No. 2004/0255090 both describe various data encoding schemes for multi-state flash memory cells. While multi-state non-volatile memory can store more data than binary non-volatile memory, the process for programming and verifying the programming can take longer for multi-state non-volatile memory.

BRIEF DESCRIPTION OF THE DRAWINGS

FIG. 1 is a perspective view of a 3D stacked non-volatile memory device.

FIG. 2 is a functional block diagram of a memory device such as the 3D stacked non-volatile memory device 100 of FIG. 1.

FIG. 3A is a block diagram of a memory structure having two planes.

FIG. 5 is a timing diagram that describes the behavior of certain signals depicted in the sense amplifier of FIG. 4.

FIG. 6 is a flow chart describing one embodiment of the operation of the circuit of FIG. 5.

FIG. 15 describes a double lockout programming process in accordance with an embodiment of the disclosed technology.

FIG. 17 is a table describing a double lockout mode of programming in accordance with an embodiment of the disclosure.

FIG. 18 is a table showing the possible cases during programming for a 3-bit per cell implementation using a double lockout programming mode.

DETAILED DESCRIPTION

Figure 3B:
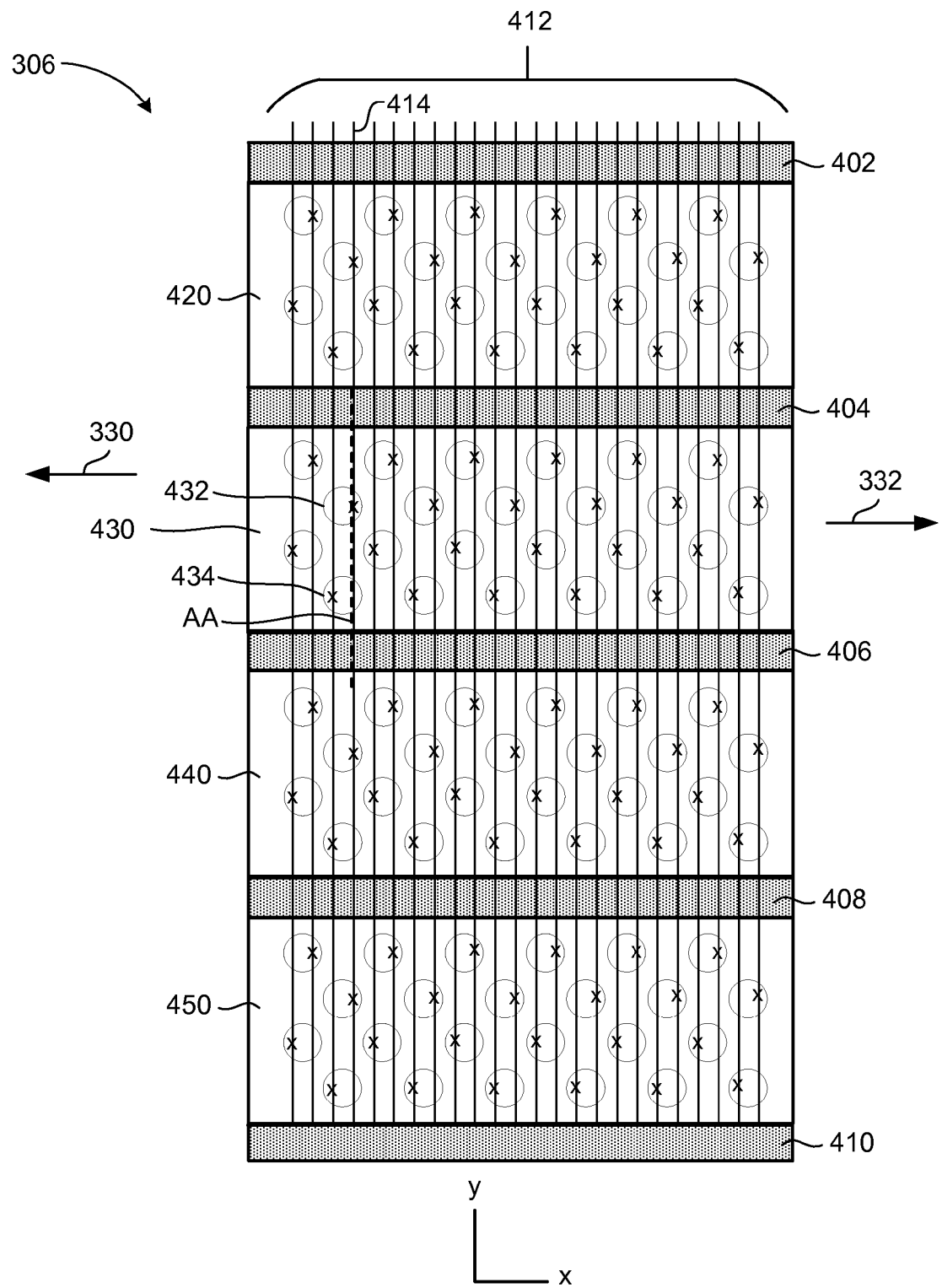
FIG. 3B depicts a top view of a portion of a block of memory cells.

The disclosed technology is directed to accurate and efficient verification sensing in non-volatile memory to provide controlled programming operations. Charge gains and losses may be experienced by charge trapping, floating gate, and other types of non-volatile memory cells. Often these gains and losses occur after verification operations are performed which may lead to memory cells moving out of a target data state after passing verification operations. Moreover, these gains and losses may lead to under and over-programming in various memory cells. In accordance with one embodiment of the disclosed technology, one or more verification operations are delayed in order to more accurately sense the threshold voltage of a corresponding memory cell. The verification operations may utilize a hidden delay so that overall performance of the non-volatile memory system is not adversely affected, due to increased program times for example.

A non-volatile memory system includes control circuitry having one or more sense circuits. The control circuitry is configured to program the non-volatile memory using multiple concurrent programming stages. Along a selected word line, a first subset of memory cells may be programmed in a first stage and a second subset of memory cells may be programmed in a second stage. The first stage is a temporary lockout stage in which memory cells are subjected to verification for their target state prior to temporarily being locked out from programming for one or more program pulses. After passing verification in the first stage, a selected memory cell is temporarily locked out and inhibited from programming during a subsequent program pulse. Following the subsequent program pulse(s), the memory cell is placed into a second programming stage. The second programming phase is a permanent lockout stage in which memory cells are subjected to a second verification before a second lockout. The memory cells may be verified for their target state to determine whether they are to be permanently locked out from programming for the remainder of the current programming operation. After the subsequent program pulse, the memory cell is again verified for its target data state. The memory cell may be programmed using one or more reduced program rates during the second stage if the memory cell fails verification. Once the memory cell passes verification in the second program stage, it is permanently locked out from programming. If the memory cell is verified at final verify level after temporarily being locked-out from programming, it can be permanently locked-out from additional programming while the remaining memory cells of the common word line complete programming for the current programming phase.

By instituting a temporary lockout to inhibit programming for one or more program pulses, and then verifying memory cells again at one or more verify levels for their target data state, a delay is provided between the program pulse and verification. The delay is accomplished without increasing the actual time between program pulses and sense pulses. Instead, programming for a next program pulse is skipped for a memory cell once it passes a verification for the target state a first time. Verification is performed again for the memory cell after the next program pulse for which the memory cell is inhibited from programming. A hidden delay is taken advantage of between the time of the verify pulse immediately following the program pulse, and the verify pulse following the program pulse for which the cell is inhibited from programming. The second verify pulse occurs after many charge gains and/or losses can be expected to occur. If a memory cell is below one or more verify levels for its target state following a temporary lockout, it can be programmed again using one or more reduced program rates.

In one embodiment, the system utilizes two or more verify levels for each target state. During the temporary lockout stage, a memory cell may be temporarily locked out and moved into the permanent lockout stage after is passes a low verify level for its target data state. A high verify level for the target data state may be used during the temporary lockout stage as well. A memory cell can be temporarily locked out and moved into the permanent lockout stage after it passes the low verify level or the high verify level for its target state. During the permanent lockout stage, the memory cell may be verified again at the low verify level for its target data state as well as a final (or high) verify level for its target state. The memory cell will be permanently locked out for programming during the current operation when it verifies at the final verify level during the permanent lockout stage.

FIG. 1 is a perspective view of a three dimensional (3D) stacked non-volatile memory device representing one example of a memory structure in which embodiments of the disclosed technology may be incorporated. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electronic circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks SB1, SB2, . . . , SBp, read/write circuits 128, and controller 122 can be considered one or more control circuits that performs the functions described herein.

The (on-chip or off-chip) controller 122 may comprise a processor 122*c* and storage devices (memory) such as ROM 122*a* and RAM 122*b*. The storage devices comprises code such as a set of instructions, and the processor 122*c* is operable to execute the set of instructions to provide the functionality described herein. Alternatively or additionally, processor 122*c* can access code from a storage device in the memory structure, such as a reserved area of memory cells connected to one or more word lines.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that this technology is not limited to a single specific memory structure, but covers many relevant memory structures within the spirit and scope of the technology as described herein and as understood by one of ordinary skill in the art.

FIG. 3A is a block diagram explaining one example organization of memory structure 126, which is divided into two planes 302 and 304. Each plane is then divided into M blocks. In one example, each plane has about 2000 blocks. However, different numbers of blocks and planes can also be used.

FIG. 3B is a block diagram depicting a top view of a portion of one block from memory structure 126. The portion of the block depicted in FIG. 3B corresponds to portion 306 in block 2 of FIG. 3A. As can be seen from FIG. 3B, the block depicted in FIG. 3B extends in the direction of arrow 330 and in the direction of arrow 332. In one embodiment, the memory array will have 48 layers. Other embodiments have less than or more than 48 layers. However, FIG. 3B only shows the top layer.

FIG. 3B depicts a plurality of circles that represent the vertical columns. Each of the vertical columns include multiple select transistors and multiple memory cells. In one embodiment, each vertical column implements a NAND string. More details of the vertical columns are provided below. Since the block depicted in FIG. 3B extends in the direction of arrow 330 and in the direction of arrow 332, the block includes more vertical columns than depicted in FIG. 3B FIG. 3B also depicts a set of bit lines 412. FIG. 3B shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 3B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 3B is divided into regions 420, 430, 440 and 450. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 3B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 3B also shows the vertical columns being staggered. In other embodiments, different patterns of staggering can be used. In some embodiments, the vertical columns are not staggered.

Figure 3C:
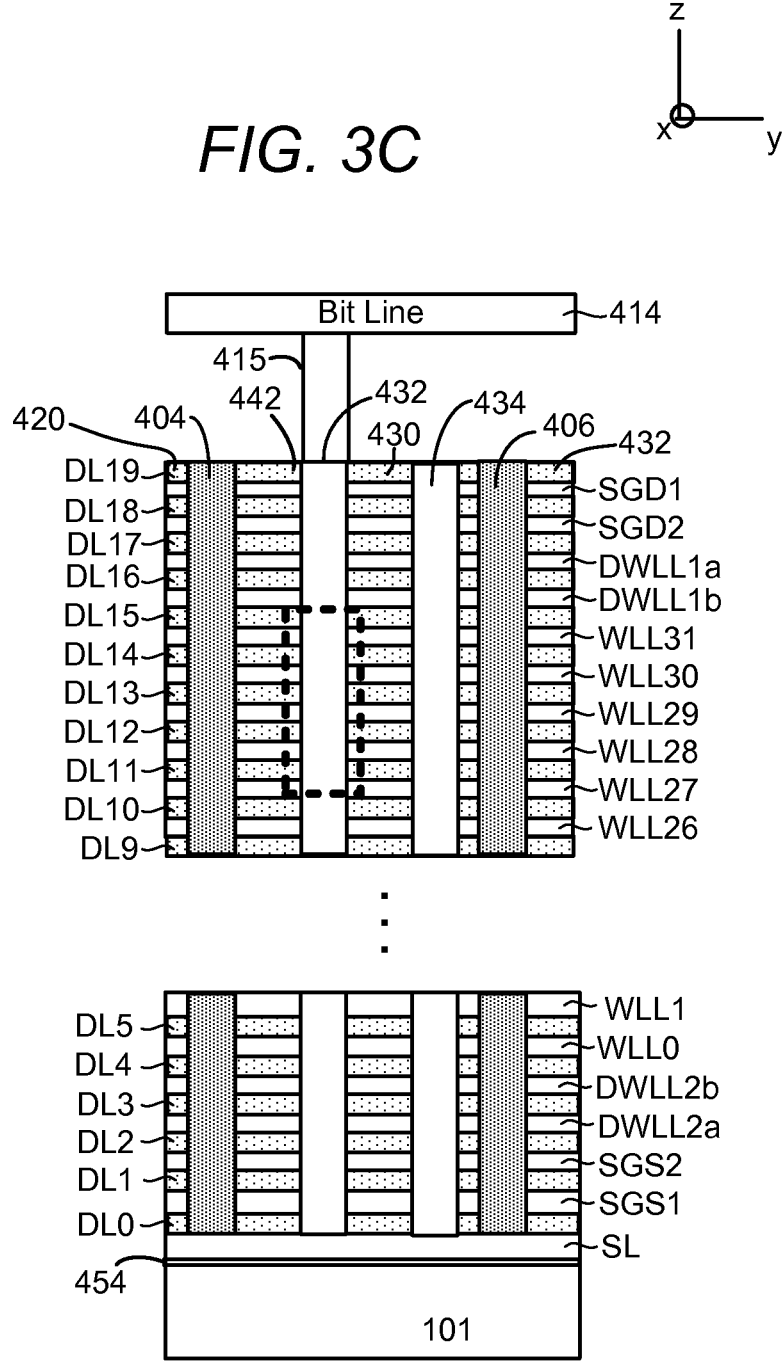
FIG. 3C depicts a cross sectional view of a portion of a block of memory cells.

FIG. 3C depicts a portion of an embodiment of three dimensional memory structure 126 showing a cross-sectional view along line AA of FIG. 3B. This cross sectional view cuts through vertical columns 432 and 434 and region 430 (see FIG. 3B). The structure of FIG. 3C includes two drain side select layers SGD1 and SGD1; two source side select layers SGS1 and SGS2; four dummy word line layers DWLL1a, DWLL1b, DWLL2a and DWLL2b; and thirty two word line layers WLL0-WLL31 for connecting to data memory cells. Other embodiments can implement more or less than two drain side select layers, more or less than two source side select layers, more or less than four dummy word line layers, and more or less than thirty two word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD1 and SGD1; source side select layers SGS1 and SGS2; dummy word line layers DWLL1a, DWLL1b, DWLL2a and DWLL2b; and word line layers WLL0-WLL31 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL19. For example, dielectric layers DL10 is above word line layer WLL26 and below word line layer WLL27. In one embodiment, the dielectric layers are made from $SiO_2$. In other embodiments, other dielectric materials can be used to form the dielectric layers.

The memory cells are formed along vertical columns which extend through alternating conductive and dielectric layers in the stack. In one embodiment, the memory cells are arranged in NAND strings. The word line layer WLL0-WLL31 connect to memory cells (also called data memory cells). Dummy word line layers DWLL1a, DWLL1b, DWLL2a and DWLL2b connect to dummy memory cells. A dummy memory cell, also referred to as a non-data memory cell, does not store user data, while a data memory cell is eligible to store user data. Thus, data memory cells may be programmed. Drain side select layers SGD1 and SGD1 are used to electrically connect and disconnect NAND strings from bit lines. Source side select layers SGS1 and SGS2 are used to electrically connect and disconnect NAND strings from the source line SL.

Figure 3D:
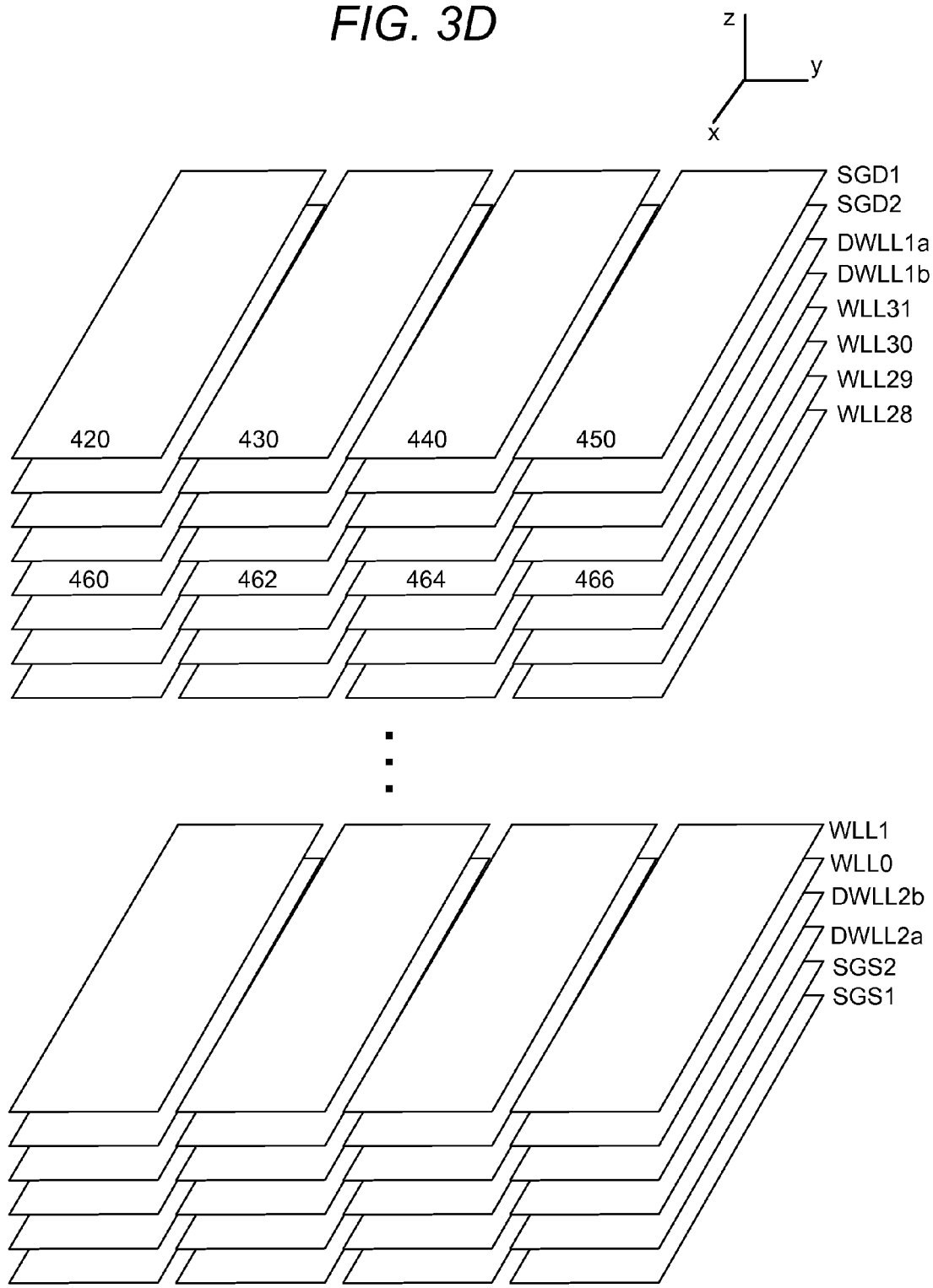
FIG. 3D depicts a view of the select gate layers and word line layers from the block of memory cells.

FIG. 3D depicts a perspective view of the conductive layers (SGD1, SGD1, SGS1, SGS2; DWLL1a, DWLL1b, DWLL2a, DWLL2b, and WLL0-WLL31) for the block that is partially depicted in FIG. 4C. As mentioned above with respect to FIG. 3B, local interconnects 401, 404, 406, 408 and 410 break up each conductive layers into four regions. For example, drain side select gate layer SGD1 (the top layer) is divided into regions 420, 430, 440 and 450. Similarly, word line layer WLL31 is divided into regions 460, 462, 464 and 466. For word line layers (WLL0-WLL31), the regions are referred to as word line fingers; for example, word line layer WLL31 is divided into word line fingers 460, 462, 464 and 466.

Figure 3E:
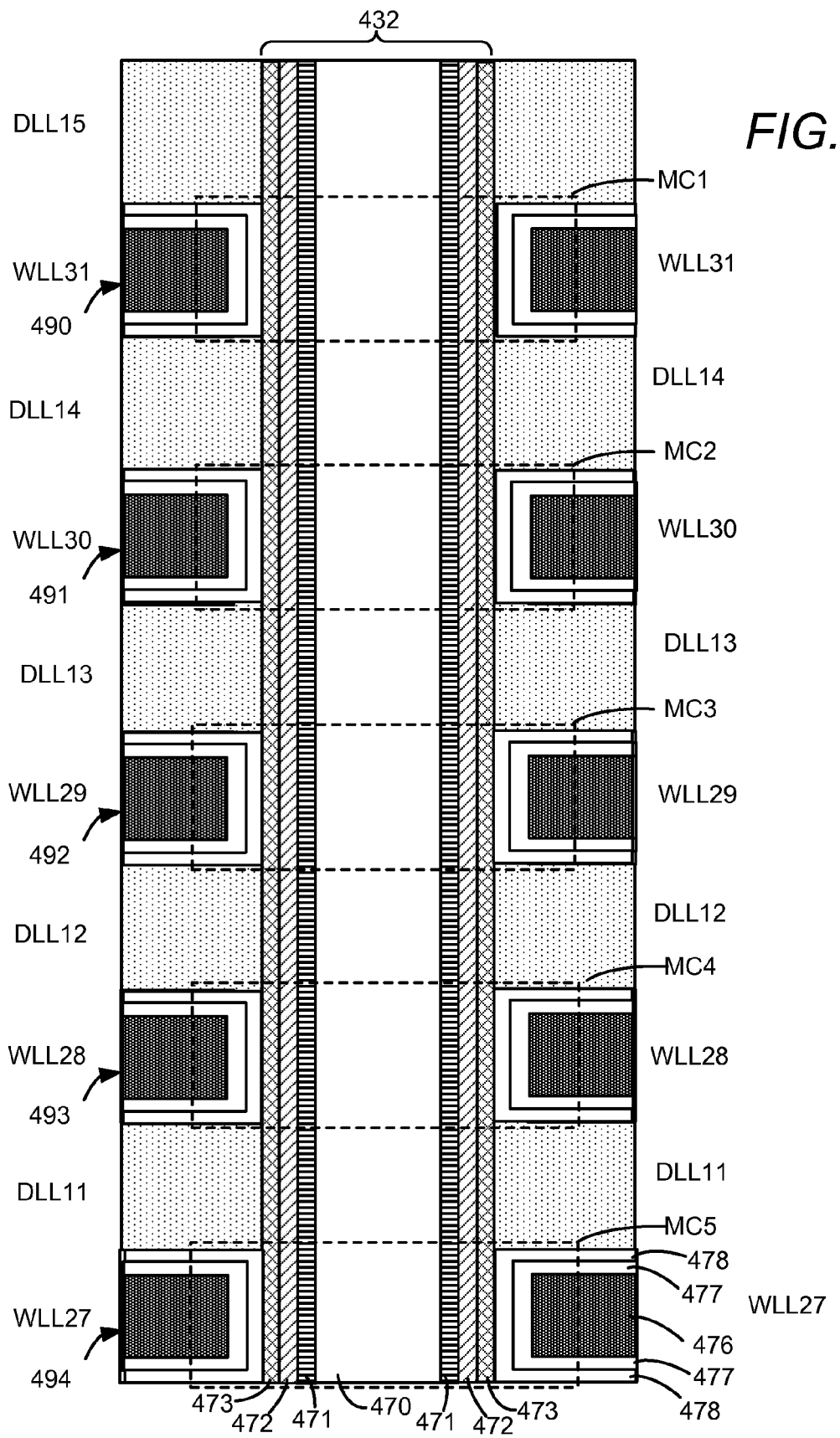
FIG. 3E is a cross sectional view of a vertical column of memory cells.

FIG. 3E depicts a cross sectional view of region 442 of FIG. 3C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) a specially formulated silicon nitride that increases trap density.

FIG. 3E depicts dielectric layers DLL11, DLL12, DLL13, DLL14 and DLL15, as well as word line layers WLL27, WLL28, WLL29, WLL30, and WLL31. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL31 and a portion of vertical column 432 comprise a memory cell MC1. Word line layer WLL30 and a portion of vertical column 432 comprise a memory cell MC2. Word line layer WLL29 and a portion of vertical column 432 comprise a memory cell MC3. Word line layer WLL28 and a portion of vertical column 432 comprise a memory cell MC4. Word line layer WLL27 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling layer 473, in response to an appropriate voltage on word line region 476. The threshold voltage (Vth) of a memory cell is increased in proportion to the amount of stored charge. During an erase operation, the electrons return to the channel or holes recombine with electrons.

The disclosed technologies can be utilized with technologies in addition to the charge trapping and floating gate flash memory described above. In addition to flash memory (e.g., 2D and 3D NAND-type and NOR-type flash memory), examples of non-volatile memory include ReRAM memories, magnetoresistive memory (e.g., MRAM), and phase change memory (e.g., PCRAM). One example of a ReRAM memory includes reversible resistance-switching elements arranged in cross pint arrays accessed by X lines and Y lines (e.g., word lines and bit lines). Programming can be supplied by a series of voltage pulses (ie doses of programming) on the word lines. Memory cells can be inhibited by applying a large enough voltage on the corresponding bit lines to prevent a sufficient voltage differential across the memory cell.

In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature. Applying appropriate temperatures (over discrete periods of time—doses) can be used to program. Similarly, adjusting temperature can be used to inhibit. In some implementations, temperatures are controlled by applying voltages and/or currents to the memory cells and/or surrounding components.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created (ie the dose of programming). This approach requires a fairly substantial current to generate the field. Therefore, the programming is applied as a unit of current. Sufficiently reducing or removing the current can be used to inhibit programming.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figure 4:
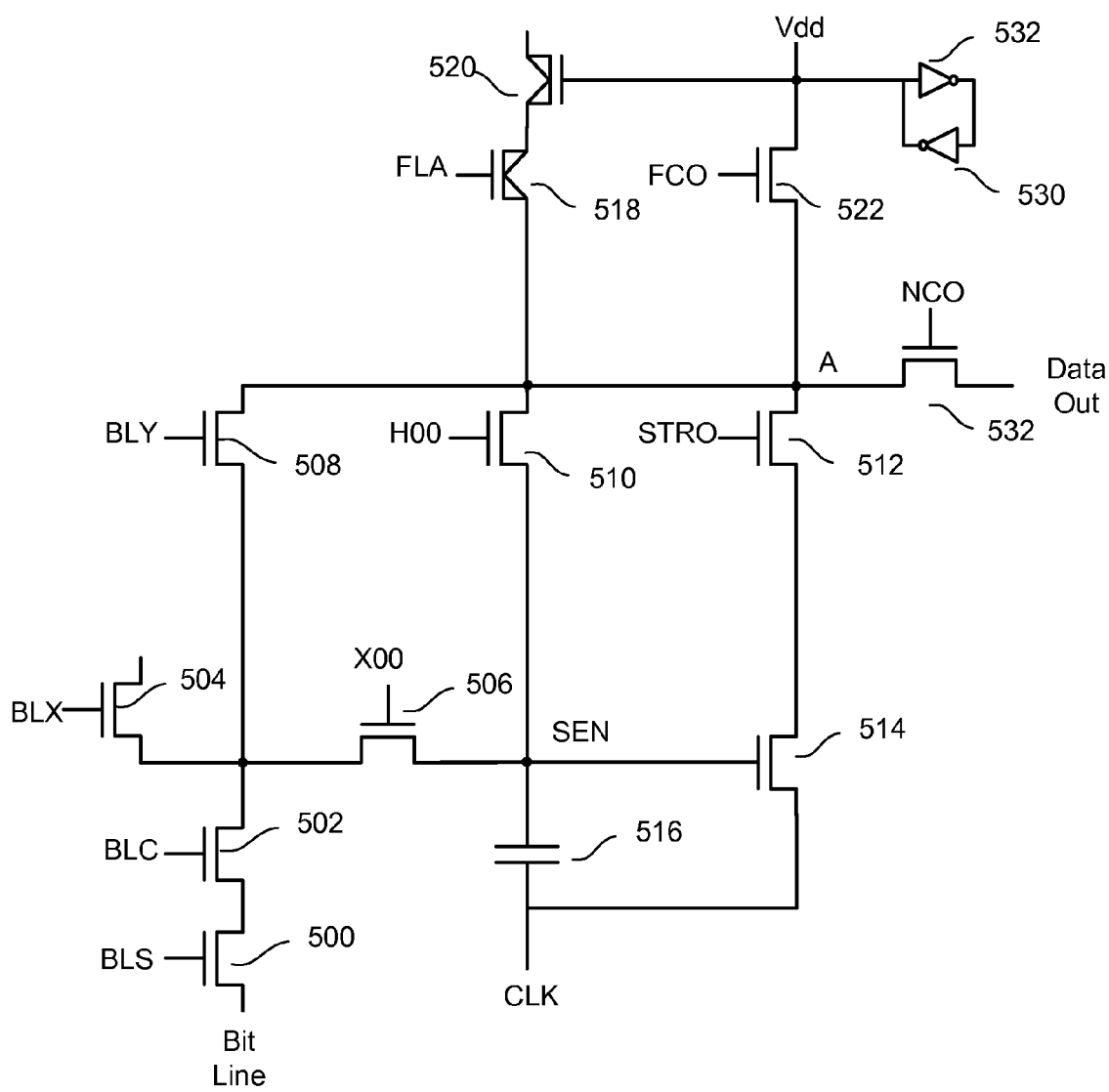
FIG. 4 is a schematic diagram of a sense amplifier.

FIG. 4 is a schematic diagram depicting a sense amplifier circuit. Each sense block SB1, SB2, . . . , SBp (see FIG. 2) includes multiple sense amplifier circuits. As described below, the circuit of FIG. 4 pre-charges a capacitor (or other charge storage device) to a pre-charge magnitude, discharges the capacitor through the memory cell for the duration of a strobe time, and senses voltage at the capacitor after the strobe time. The sense voltage will be indicative of whether the memory cells conducted the current being sensed for, which is indicative of whether the threshold voltage of the memory cell is greater than or less than threshold voltage being tested for. If the threshold voltage of the memory cell is greater than the threshold voltage being tested, then, during a verify operation, the memory cell will complete programming, as appropriate based on the processes described herein. FIG. 4 shows transistor 500 connected to the Bit Line and transistor 502. Transistor 500 receives the signal BLS at its gate, and is used to connect to or isolate the Bit Line. Transistor 502 receives the signal BLC at its gate, and is used as a voltage clamp. The gate voltage BLC is biased at a constant voltage equal to the desired Bit Line voltage plus the threshold voltage of transistor 502. The function of transistor 502, therefore, is to maintain a constant Bit Line voltage during a sensing operation (during read or verify), even if the current through the Bit Line changes.

Transistor 502 is connected to transistors 504, 506 and 508. Transistor 506 is connected to capacitor 516 at the node marked SEN. The purpose of transistor 506 is to connect capacitor 516 to Bit Line 500 and disconnect capacitor 516 from Bit Line 500 so that capacitor 516 is in selective communication with Bit Line 500. In other words, transistor 506 regulates the strobe time. That is, while transistor 506 is turned on capacitor 516 can discharge through the Bit Line, and when transistor 506 is turned off capacitor 516 cannot discharge through the Bit Line.

The node at which transistor 506 connects to capacitor 516 is also connected to transistor 510 and transistor 514. Transistor 510 is connected to transistors 508, 512 and 518. Transistor 518 is also connected to transistor 520. Transistors 518 and 520 are PMOS transistors while the other transistors of FIG. 4 are NMOS transistors. Transistors 510, 518, and 520 provide a pre-charging path to capacitor 516. A voltage (e.g. Vdd or other voltage) is applied to the source of transistor 520. By appropriately biasing transistors 510, 518 and 520, the voltage applied to the source of transistor 520 can be used to pre-charge capacitor 516. After pre-charging, capacitor 516 can discharge through the Bit Line via transistor 506 (assuming that transistors 500 and 502 are conducting).

Although a charge-trapping 3D memory structure embodiment is described above, the technology described herein can apply to other types of 3D memory structures as well as 2D memory structures (including NAND, NOR, and others). For example, the technology described herein can apply to floating gate memories as well.

The circuit of FIG. 4 includes inverters 530 and 532 forming a latch circuit. The output of inverter 532 is connected to the input of inverter 530 and the output of inverter 530 is connected to the input of inverter 532. as well as transistors 520 and 522. The input of inverter 532 will receive Vdd and the two inverters 530, 532 will act as a latch to store Vdd. The input of inverter 532 can also be connected to another value. Transistors 512 and 522 provide a path for communicating the data stored by inverters 530 and 532 to transistor 514. Transistor 522 receives the signal FCO at its gate. Transistor 512 receives the signal STRO at its gate. By raising or lowering FCO and STRO, a path is provided or cut off between the inverters 530, 532 and transistor (sensing switch) 514. The gate of transistor 514 is connected capacitor 516, transistor 506 and transistor 510 at the node marked SEN. The other end of capacitor 516 is connected to the signal CLK.

As discussed above, capacitor 516 is pre-charged via transistors 510, 518 and 520. This will raise the voltage at the SEN node to a pre-charge voltage level (Vpre). When transistor 506 turns on, capacitor 516 can discharge its charge through the Bit Line and the selected memory cell if the threshold voltage of the memory cell is below the voltage level being tested for. If the capacitor 516 is able to discharge, then the voltage at the capacitor (at the SEN node) will decrease.

The pre-charge voltage (Vpre) at the SEN node is greater than the threshold voltage of transistor 914; therefore, prior to the strobe time, transistor 514 is on (conducting). Since transistor 514 is on during the strobe time, then transistor 512 should be off. If the capacitor does not discharge during the strobe time, then the voltage at the SEN node will remain above the threshold voltage of transistor 514 and the charge at the inverters 530, 532 can be discharged into the CLK signal when STRO turns on transistor 512. If the capacitor discharges sufficiently during the strobe time, then the voltage at the SEN node will decrease below the threshold voltage of transistor 514; thereby, turning off transistor 914 and the data (e.g., Vdd) stored at inverters 530, 532 from being discharged through CLK. So testing whether the diodes 530, 532 maintain their charge or discharge will indicate the result of the verification process. In one embodiment, the result can be read at node A via transistor 534 (Data Out) by turning on transistor 534 gate signal NCO.

The pre-charge level of capacitor 516 (and, thus, the pre-charge voltage at node SEN) is limited by the current passing through transistor 510. The current that passes through transistor 510 is limited by the gate voltage H00. As such, the pre-charge voltage at node SEN is limited by the voltage H00 less the threshold voltage of transistor 510. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

When the system performs a read or verify operation (both are sense operations), the voltage applied to the control gate of the cell may cause the channel (connected to the bit line) of the cell to conduct. If this happens, a capacitor is discharged through the channel, lowering in voltage as it discharges.

FIG. 5 is a timing diagram describing the behavior of various signals from FIG. 5. The signal BLS is at Vdd the entire time depicted and the signal BLC is at Vbl+Vsrc+Vth, where Vbl is the voltage of the Bit Line, Vsrc is the voltage of the source line and Vth is the threshold voltage of transistor 502. The signal FLA starts at Vss at t0 and goes to Vdd at t6. When the signal FLA is at Vss, the pre-charging path is regulated by transistor 510. At t0, the voltage of H00 is raised from ground to a pre-charge level. The raising of the voltage at H00 turns on transistor 510 and opens up the pre-charge path. The magnitude of the voltage at H00 is set. FIG. 5 shows H00 going to Vhoo. The signal H00 will stay at the pre-charge voltage (Vhoo) until time t1. While H00 is high, transistor 510 turns on and capacitor 516 will pre-charge between t0 and t1, as depicted by the voltage at SEN. At time t1, H00 is brought down to Vss and the pre-charging is completed.

The signal X00 is used to allow capacitor 516 to be in communication with the Bit Line so that the capacitor can discharge through the Bit Line and selected memory cell. At time t3, X00 is raised to Vblc+Vblx, where Vblc is the voltage of the signal BLC and Vblx is the voltage of the signal BLX (both discussed above). At time t4, the voltage at X00 is lowered to Vss. Between times t3 and t4, known as the strobe time, capacitor 516 will be in communication with the Bit Line in order to allow it to discharge through the Bit Line and the selected memory cell (depending on the threshold voltage of the selected memory cell). The signal CLK is raised to Vblx at time t2 and lowered back down to Vss at time t5 to prevent any fighting conditions in the circuit and to allow proper discharge of capacitor 516.

As discussed above, because H00 is raised between t0 and t1, capacitor 516 (and SEN node) will charge up between t0 and t1 (the pre-charge). This is depicted in FIG. 6 with the SEN node charging from Vss to Vpre. The solid line for Vpre represents an example pre-charging of the node SEN (and capacitor 516) in response to Vh00 being applied to the gate of transistor 510.

When X00 is raised up at t3, capacitor 516 can initially pre-charge the bit line and then discharge through the Bit Line (if the threshold voltage is at the appropriate level). As depicted in FIG. 6 between t3 and t4, the voltage at the SEN node can will dissipate from Vpre to Vpost_con if the memory cell turns on (conducts) because its threshold voltage is less than or equal to the voltage being applied to its control gate. If the threshold voltage for the memory cell being tested is higher than the voltage applied to its control gate, capacitor 516 will not discharge and the voltage will remain at Vpre. The period between t3 and t4 is the strobe time and can be adjusted, as described above.

FIG. 5 shows that the signal FCO is raised to Vdd at t7 and lowered to Vss at T9. The signal STRO is raised to Vdd at t8 and lowered at t9. Between times t8 and t9, there is a path between the inverters 530, 532 and transistor 514. If the voltage at the node SEN is greater than the threshold voltage of transistor 514, then there will be a path from the inverters 530, 532 to CLK and the data at the inverters 530, 532 will dissipate through the signal CLK and through the transistor 514. If the voltage at the node SEN is lower than threshold voltage of transistor 514 (e.g. if the capacitor discharged), then transistor 514 will turn off and the voltage stored by the inverters 530, 532 will not dissipate into CLK. FIG. 5 shows the voltage level at node A at Vdd. If the voltage of the capacitor does not dissipate (e.g., due to not enough current flowing because the threshold voltage of the selected memory cell is greater than the voltage being tested for), then transistor 514 will remain on and the voltage at node A will dissipate to Vss (as depicted by the dashed line). If the voltage of the capacitor does dissipate (e.g., due to sufficient current flowing because the threshold voltage of the selected memory cell is below the voltage being tested for), then transistor 514 will turn off and the voltage at node A will remain at Vdd (as depicted by the solid line). The output of node A is provided to the Data Out signal via transistor 534 by applying Vdd to the signal NCO.

FIG. 6 is a flow chart describing a single strobe sensing operation performed according to the timing diagram of FIG. 5. In step 602, the appropriate verify reference voltage (e.g., Vv1, Vv2, Vv3, Vv4, Vv5, Vv6, or Vv7—see FIG. 8) is applied to the selected word line. The selected word line is connected to the memory cells being programmed and verified. The bit lines connected to the memory cells being programmed and verified are charged to a pre-determined pre-charge level. In step 604, all of the SEN nodes are pre-charged. In step 606, capacitors in the sense amplifiers (e.g. capacitor 516) are provided a path to discharge through the memory cells (see SEN node t5-t6 of FIG. 6). After a predetermined time period, referred to as the "strobe time" or "integration time" the voltage of the capacitor 516 (or the SEN node) is sampled as described above to see whether the respective memory cell(s) conducted in step 608. As described above, the verification process is performed simultaneously for thousands of memory cells connected to the same word line and different bit lines.

At the end of a successful programming process (with verification), the threshold voltages of the memory cells should be within one or more distributions of threshold voltages for programmed memory cells or within a distribution of threshold voltages for erased memory cells, as appropriate.

Figure 7:
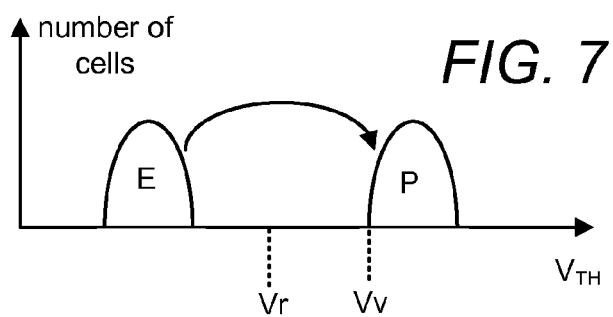
FIG. 7 depicts an example set of threshold voltage distributions and describes a process for programming non-volatile memory.

FIG. 7 illustrates example threshold voltage distributions for a memory cell array when each memory cell stores one bit of data. Other embodiments, however, may use more than one bit of data per memory cell (e.g., such as two, three, or four bits of data per memory cell). FIG. 7 shows two threshold voltage distributions (corresponding to two data states). The first threshold voltage distribution (data state) E represents memory cells that are erased. The second threshold voltage distribution (data state) P represents memory cells that are programmed. The curved arrow indicates the programming process where some memory cells are programmed from E to P. In one embodiment, memory cells in data state E store a logical "1" and memory cells in data state P store a logical "0." In one embodiment, the threshold voltages in E are negative and the threshold voltages in P are positive. FIG. 7 also depicts a read reference voltage Vr and verify reference voltage Vv. By testing whether the threshold voltage of a given memory cell is above or below Vr, the system can determine whether the memory cell is erased (E) or programmed (P). When programming memory cells, the system will test whether those memory cells have a threshold voltage greater than or equal to Vv.

Figure 8:
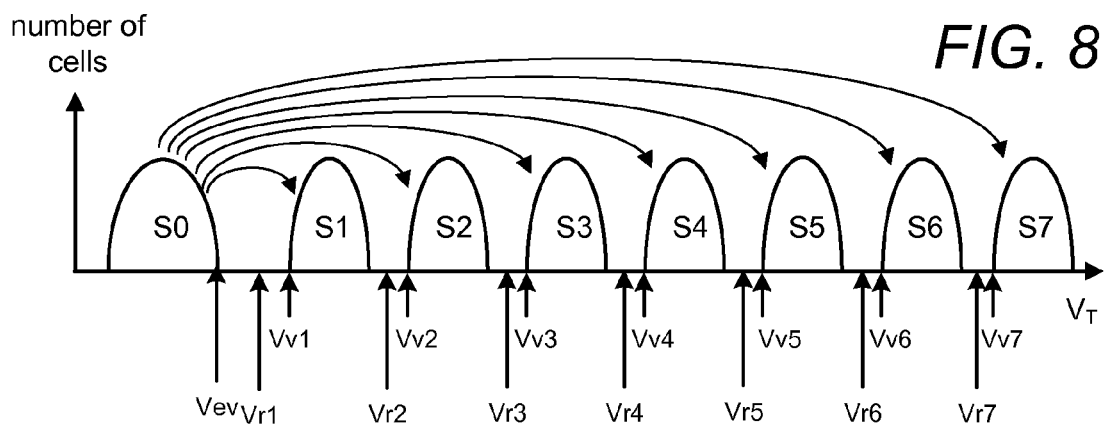
FIG. 8 depicts an example set of threshold voltage distributions and describes a process for programming non-volatile memory.

FIG. 8 illustrates example threshold voltage distributions for a memory cell array when each memory cell stores three bits of data. Other embodiments, however, may use more or less than three bits of data per memory cell (e.g., such as three bits of data per memory cell). In the example of FIG. 8, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 10.

FIG. 8 shows a set of verify target levels Vv1, Vv2, Vv3, Vv4, Vv5, Vv6, and Vv7. These verify levels are used as comparison levels (also known as target levels and/or compare levels) during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 8 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine for which states that memory cells are storing data.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 8) or verify operation (e.g. see verify target levels Vv1, Vv2, Vv3, Vv4, Vv5, Vv6, and Vv7 of FIG. 10) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 9:
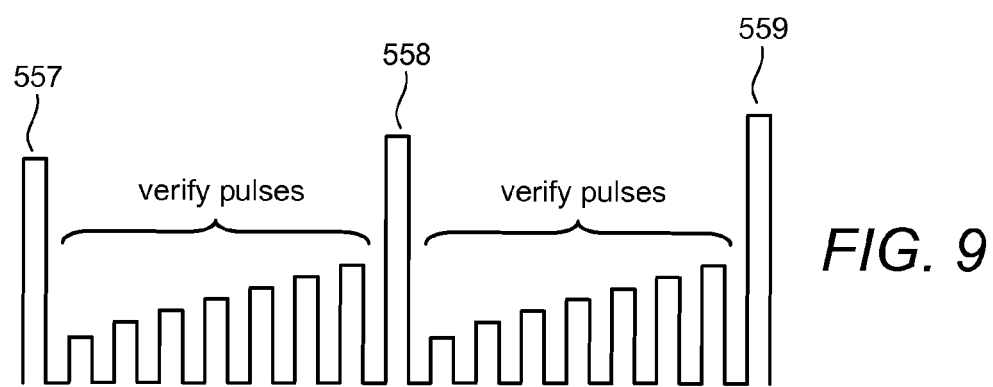
FIG. 9 depicts three programming pulses, and the verify pulses applied between the programming pulses.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 9 shows a portion of a signal applied to the control gates of a plurality of memory cells connected to a common word line. FIG. 9 shows a voltage waveform including programming pulses 557, 558 and 559, with a set of verify pulses between the programming pulses. Typically, a program process may use 10-20 programming pulses. When performing full sequence programming in one embodiment, the verification process between programming pulses will test for each of the threshold voltage distribution (data states) S1-S7. Therefore, FIG. 9 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 0 have reached Vv2, there is no reason to verify at Vv7. Verify operations can be performed at one or more verify levels for a target state. For example, a single reference voltage can be applied on the common word line as shown in FIG. 123 and a bit line voltage or strobe time varied to perform sensing at a low and verify level. The single reference voltage applied to the common word line is the respective verify pulse of FIG. 13 in one example.

Figure 10A:
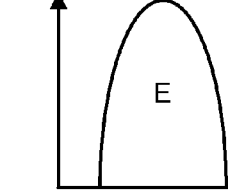
FIGS. 10A-10E depict various threshold voltage distributions and describe a process for programming non-volatile memory.
Figure 10B:
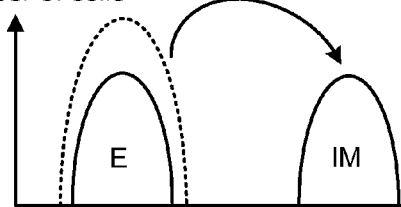

FIG. 8 shows a programming process that includes one phase where all memory cells connected to the same word line are programmed concurrently during that one phase. FIGS. 10A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 10A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 10B. Memory cells being programmed to intermediate state IM are programmed to a target threshold voltage of VvIM.

Figure 10C:
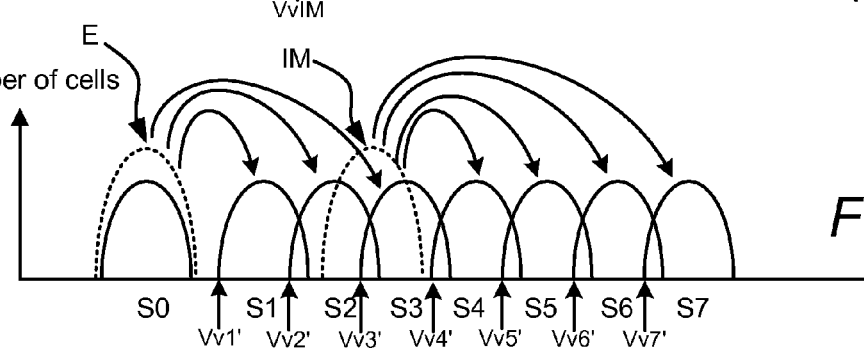
Figure 10D:
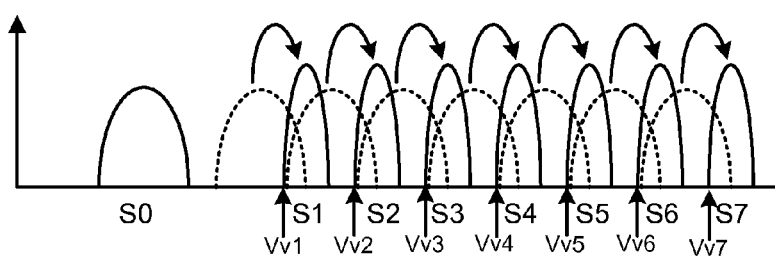
Figure 10E:
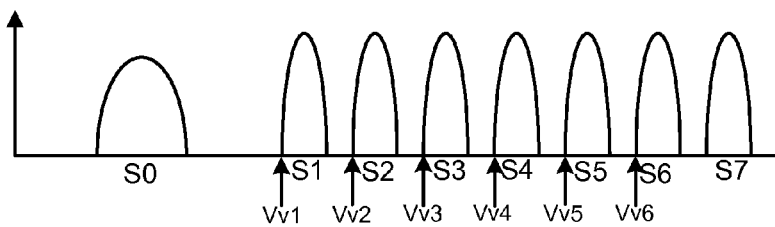

During the second phase of the programming process, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 10C. The second phase of programming may be referred to as a "foggy" programming phase.

As can be seen in FIG. 10C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third phase of programming, each of data states S1-S7 are tightened so that they no longer overlap with neighboring states. This is depicted graphically by FIG. 10D. The final result of the three phrase programming process is depicted in step 10E, which shows data states S0-S7. In some embodiments, data state S0 is wider than data states S1-S7.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

When programming non-volatile memory, charge shifts may occur after a program pulse has been applied to a group of memory cells and the memory cells are verified for their target states. For example, electrons may continue to accumulate in a charge trapping or floating gate material after a program pulse is applied. This additional accumulation of electrons may lead to an increase in the apparent threshold voltage of a memory cell after a verification operation is performed following the program pulse. Additionally, electrons may leak out of a these memory materials after a program pulse has been applied to a memory cell. The leakage of electrons from the memory cell may lead to a decrease in the apparent threshold voltage of the memory cell after a verification operation following the program pulse.

Figure 11A:
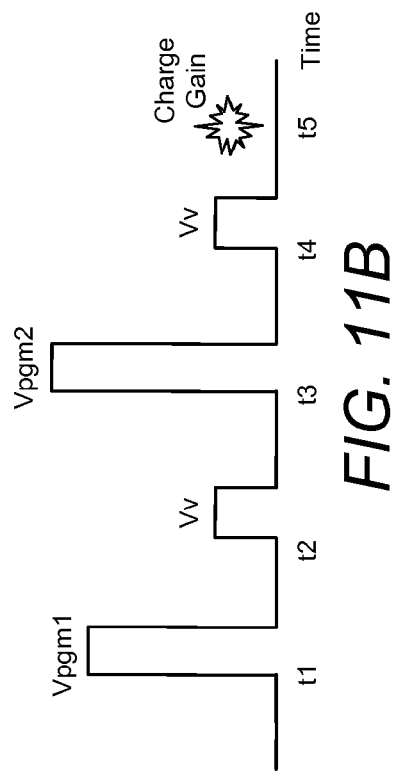
FIGS. 11A-11B describe a charge gain that may occur after applying a program pulse.
Figure 11B:
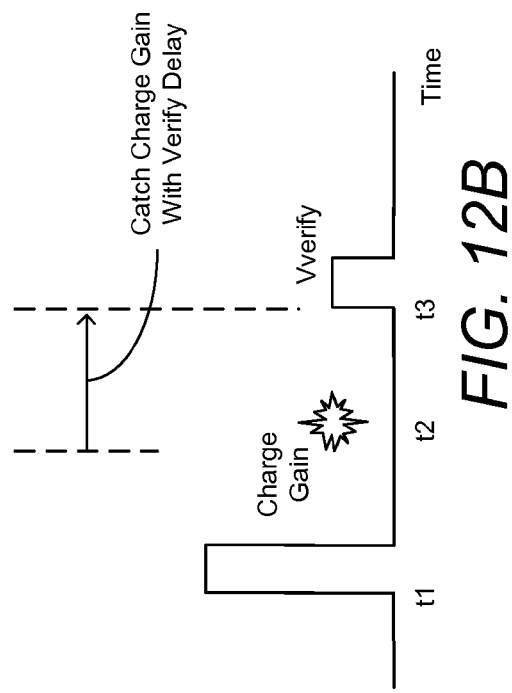

FIGS. 11A-11B depict a charge gain that may occur after applying a program pulse. A programming process for an example memory cell 614 is depicted relative to a threshold distribution 616 for a target data state. Memory cell 614 has a threshold voltage below the target verify voltage Vv for the target data state prior to a program pulse being applied at time t1. The first program pulse moves the threshold voltage of memory cell 614 in the positive direction. The memory cell is verified at time t2 for the verify level Vv. The threshold voltage of memory cell 614 remains below Vv at time t2. The system applies a second program pulse Vpgm2 at time t3, raising the threshold voltage of memory cell 614 again. The memory cell is verified at time t4 for the verify level Vv. Memory cell 614 is locked out from further programming when the system determines that the memory cell has a threshold voltage above Vv. The memory cell is inhibited from programming during the remaining program pulses of the series that are applied to the word line for the current programming phase. For example, an inhibit voltage may be applied to the bit line of memory cell 604 while applying additional program pulses to the word line.

Memory cell 614 may experience a charge gain after programming completes or during the programming process. Memory cell 614 experiences an upshift in threshold voltage at time t5, after passing verification at the Vv voltage level at time t4. The charge gain may result from additional electrons accumulating in the charge trapping material of the memory cell after applying program pulse Vpgm2 and verifying at Vv. The charge gain results in the threshold voltage of memory cell 614 shifting in the positive direction. The charge gain is enough in this case to shift the threshold voltage outside of the nominal range of threshold voltages associated with the target data state. As such, the distribution of threshold voltages corresponding to the target data state is widened by the additional accumulation of electrons after verification leading to a tail at the falling edge of distribution 616.

Figure 12A:
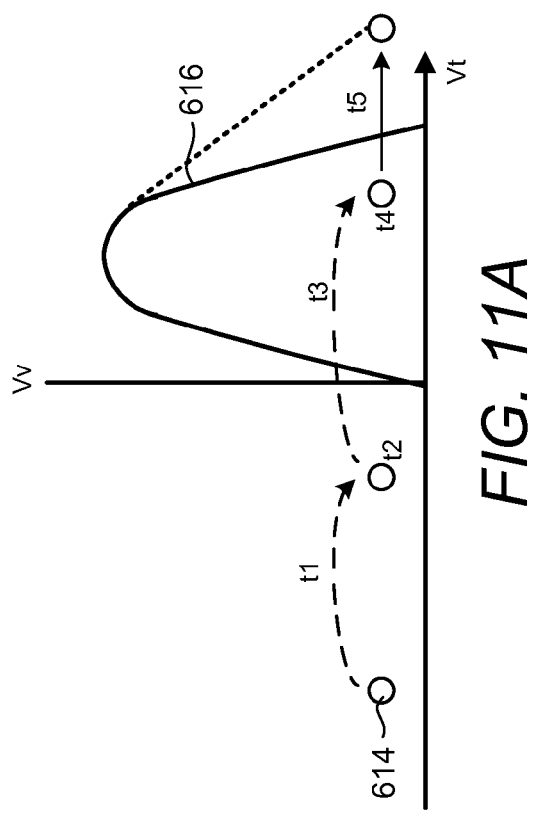
FIGS. 12A-12B describe a delay between a program pulse and a verify pulse to detect charge gain.
Figure 12B:
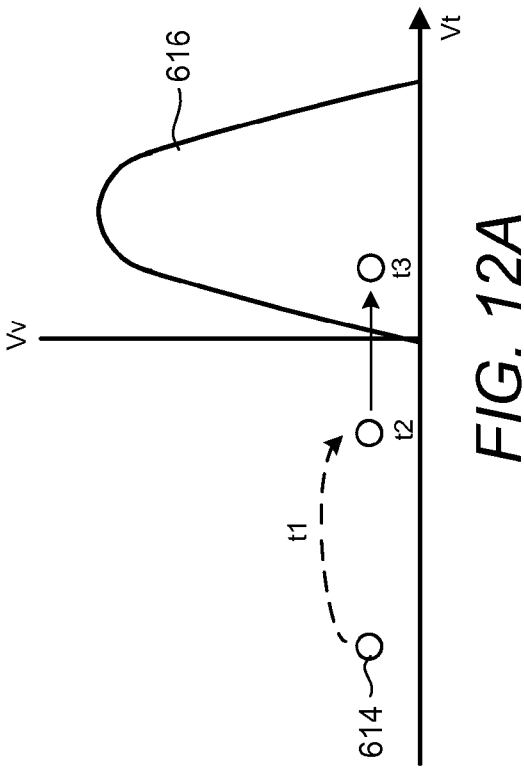

FIGS. 12A-12B illustrate that a delay can be introduced between a program pulse and a verify pulse to tighten the distribution of threshold voltages corresponding to a target data state. In FIG. 12A, program pulse Vpgm1 is applied at time t1. A delay is introduced between program pulse Vpgm1 and verify pulse Vv by shifting the verify pulse to time t3. The delayed verify pulse allows the charge gain at time t2 to be detected. Memory cell 614 passes verification at Vv at time t3. By using a delay, the charge gain by memory cell 614 occurs prior to verification.

Figure 13A:
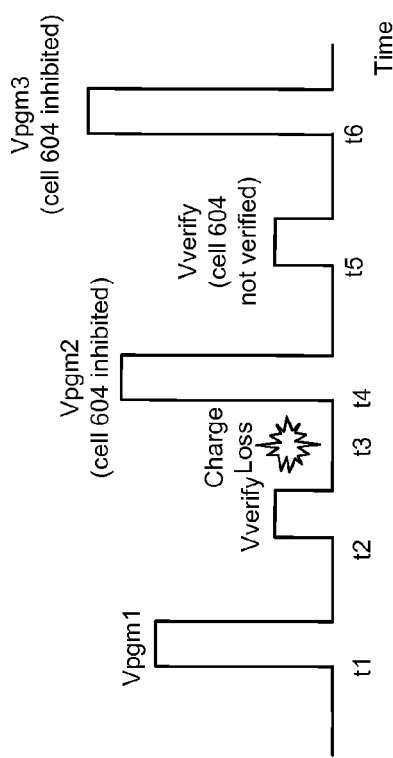
FIGS. 13A-13B describe a charge loss that may occur after applying a program pulse.
Figure 13B:
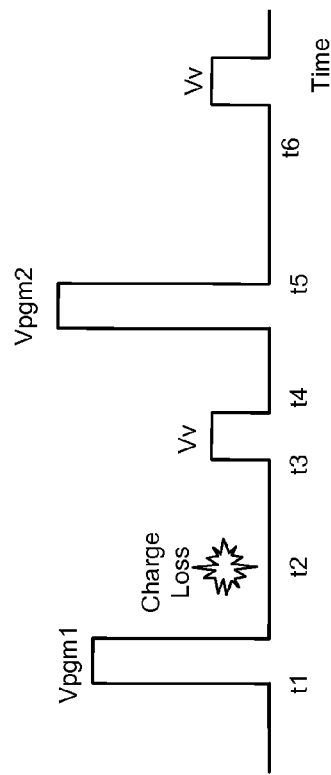

Memory cells may also experience a drop in threshold voltage resulting from electrons leaking or otherwise being removed from the charge trapping or floating gate material following verification. As shown in FIG. 13A for example, memory cell 614 may be programmed at time t1 from a threshold voltage below to a threshold voltage above the target level Vv. Verification at time t2 determines that the threshold voltage has reached the verify level. Memory cell 614 loses charge at time t3, lowering its threshold voltage below Vv. Because memory cell 614 is permanently locked out from programming at time t2, the loss of charge may not be detected resulting in an error.

Traditionally, memory cells are permanently locked out from additional programming after they are verified as having reached the verify level for a target data state. That is, the bit line of a memory cell that has passed verification is raised to a high voltage level to inhibit the memory cell from being further programmed as a result of program pulses applied to the memory cell's word line in order to continue programming for other memory cells along the word line that have not reached their target verify levels. These memory cells do not undergo further verification or additional programming.

Figure 14A:
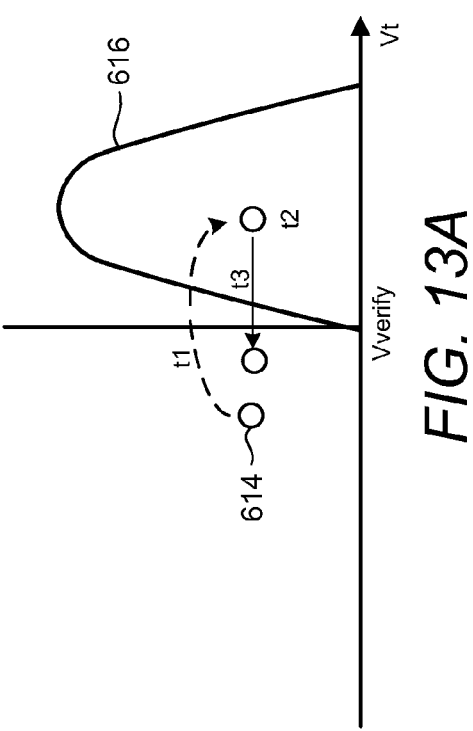
FIGS. 14A-14B describe a delay between a program pulse and a verify pulse to detect charge loss.
Figure 14B:
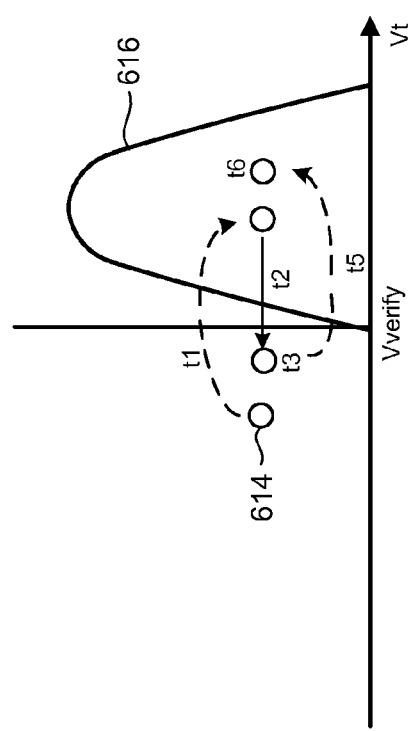

Charge loss can be detected by introducing a delay as shown in FIGS. 14A-14B to shift the verify operation to time t3. The charge loss at time t2 occurs prior to verification so that memory cell 604 does not pass verification at time t3. Memory cell 604 undergoes additional programming at time t5 and then passes verification at time t6.

Although these delay techniques may detect some charge losses and gains to narrow the programmed distributions of memory cells, they will also introduce longer program times. The verification operation is delayed following each of the program pulses so that a longer verification time is needed. When considering that the number of program pulses may be around 20, the cumulative time to introduce a delay will lead to longer operation time and poorer device performance.

A double lockout programming technique is provided in accordance with one embodiment that provides a hidden delay between programming and verification. A temporary lockout stage and a permanent lockout stage are provided for double lockout programming. The temporary lockout stage precedes the permanent lockout phase and is used to determine when a delay should be instituted by temporary locking the memory cell. When a memory cell initially passes verification for its target state, it is temporarily locked out from programming for the next program pulse. This lockout period provides a hidden delay before the memory cell is verified again during the permanent lockout stage.

The memory cell is placed into the permanent lockout stage after initially passing verification for the target state. After applying the next programming pulse, the memory cell is verified again for the target state. If a charge loss or gain has occurred, it may be detected by this additional verification. If the memory cell requires further programming to reach its target data state, it can be programmed further. In this manner, the overall time between the program pulse and verify pulse(s) does not need to change or otherwise be extended. A temporary lockout can be used, followed by additional verification and programming if necessary before permanent locking out a memory cell from programming. The delay between the program pulse and the second verify pulse is provided by the temporary lockout rather than increasing the actual time between pulses. One or more reduced program rates may be used to accurately program the memory cell to its target data state after a temporary lockout if needed.

If the memory cell is not verified at the low verify level after the temporary lockout, it can be subjected to additional programming at a second rate of programming that is slower than the first rate of programming used during the temporary lockout stage. In this way, the memory cell can be programmed slower than a memory cell that has not been verified at any level. If the memory cell is verified at the low verify level but not the high verify level after temporary lockout, it can be subjected to additional programming at a third rate that is less than the first and second rates of programming. These reduced levels of programming may avoid undue overprogramming of the target memory cell as may otherwise occur due to the larger increase in the program pulse that is applied to the memory cell since it was last subjected to programming before the lockout.

FIG. 15 describes a double lockout programming process in accordance with an embodiment of the disclosed technology. A graph is depicted including a threshold voltage distribution 612 for a target data state, plotted as the number of memory cells having a given threshold voltage. The programming and verification process is illustrated by way of example including six memory cells that each exhibit a unique programming behavior. In the described examples, a memory cell that is active or otherwise enabled for programming is denoted by an open circle, a memory cell that is temporarily locked-out from programming for a next program pulse is denoted by a circle having hashing, and a memory cell that is permanently locked-out from programming for all subsequent program pulses of the program voltage signal for a current programming stage is denoted by a black circle.

Two verify levels VL and VH are established for programming memory cells to the target data state 612. The higher verify level VH may be a traditional verify level establishing the minimum threshold voltage for the target data state in one embodiment. The lower verify level VL is lower than the higher verify level VH and is used for temporarily locking out memory cells for the temporary lockout stage. The lower verify level is also used to enable different programming rates during the permanent lockout tage. The memory cells of a group of memory cells being programmed can be verified at both the VL and VH verify levels during the temporary lockout stage. When a memory cell passes the low-level verification for the target data state at VL or VH, it can be temporarily locked-out for a next programming pulse. Alternatively, the memory cells may be verified at only the low verify level VL or the high verify level VH initially to determine whether to temporarily lockout a memory cell.

In the first example (1), an active memory cell undergoes programming during application of a first program pulse. The threshold voltage of the memory cell is raised from below the low verify level VL to above VL, but below the high verify level VH. In response to verifying that the memory cell is above VL, the system temporary locks out the memory cell from programming. The memory cell is locked-out for programming during the next program pulse in one embodiment. In an alternative embodiment, the memory cell may be locked out from programming during more than one program pulse. After the next program pulse is applied, the memory cell is again verified at the low verify level VL and the high verify level VH. Even though the memory cell was locked out from programming, the system again verifies the memory cell for the low and high verify levels. The system permanently locks out the memory cell from programming during the current programming phase in response to verifying at VH.

The temporary lockout of the memory cell after programming to the low verify level VL provides a delay between programming and final verification of the memory cell for its target state. This permits an unexpected charge gain to be accounted for during verification by using a delay between programming and verification that is hidden in the programming process. The system does not increase the actual time between a program pulse and a following verification pulse. Instead, the system delays the verification process itself using a temporary lockout to allow the memory cell to experience the unexpected charge gain prior to performing a final verification for the target memory cell.

In the second example (2), an active memory cell undergoes programming during the first program pulse. The threshold voltage is raised above VL such that the system temporarily locks out the memory cell from programming as in the first example. The memory cell is again verified at the low verify level VL and the high verify level VH after the second program pulse. The memory cell undergoes an upshift in threshold voltage due to an unexpected charge gain (or other reason). The threshold voltage remains below the high verify level VH after the temporary lockout. In response, the memory cell returns to an active state for programming during the third program pulse. The system applies the third program pulse without inhibiting the memory cell from being programmed. The system verifies the memory cell at the low verify level VL and the high verify level VH following the third program pulse. The memory cell passes verification at the high verify level VH following the third program pulse. The system permanently locks out the memory cell from programming by additional program pulses during the current programming phase.

In the third example (3), the threshold voltage of the memory cell is raised from below VL to above the high verify VH by the first pulse. The system temporarily locks out the memory cell from programming. Even though the memory cell is determined to have passed verification at the high verify level VH, the system temporarily, rather than permanently, locks out the memory cell. In this manner, a subsequent loss of charge that reduces the threshold voltage of the memory cell may be detected so that additional programming to reprogram the memory cell can be performed. After applying the second program pulse with the memory cell locked out from programming, the system again verifies the memory cell for the low verify level VL and the high verify level VH. In this example, the memory cell undergoes a slight upshift in threshold voltage after the second program pulse. The threshold voltage remains above the high verify level VH after the temporary lockout. In response, the system permanently locks out the memory cell from programming by additional program pulses during the current programming phase.

In the fourth example (4), the threshold voltage of the memory cell is raised from a level below the low verify level VL to a level above the high verify VH. The system temporarily locks out the memory cell from programming. The second program pulse is applied with the memory cell inhibited from programming. After applying the second program pulse, the system again verifies the memory cell for the low verify level VL and the high verify level VH. The memory cell undergoes a downshift in threshold voltage after the second program pulse. The threshold voltage remains above the low verify level VL after the temporary lockout but is now below the high verify level VH. In response, the memory cell returns to an active state for programming during the third program pulse. The system applies the third program pulse without inhibiting the memory cell from being programmed. The system verifies the memory cell at the low verify level VL and the high verify level VH. The memory cell passes verification at the high verify level VH following the third program pulse. The system permanently locks out the memory cell from programming by additional program pulses during the current programming phase.

In the fifth example (5), the threshold voltage of the memory cell is raised from below VL to a level above VL but below VH. The system temporarily locks out the memory cell by inhibiting the memory cell from programming during the second program pulse. The memory cell is verified at the low verify level VL and the high verify level VH after the next program pulse. The memory cell undergoes a downshift in threshold voltage. The threshold voltage falls below VL after the temporary lockout. In response, the memory cell returns to an active state for programming during the third program pulse. The system applies the third program pulse without inhibiting the memory cell from being programmed. The system verifies the memory cell at the low verify level VL and the high verify level VH following the third program pulse. The memory cell passes verification at the high verify level VH following the third program pulse. The system permanently locks out the memory cell from programming during the current programming phase.

In the sixth example (6), the threshold voltage of the memory cell is raised from below VL to above VH by the first program pulse. The system temporarily locks out the memory cell from programming. The second program pulse is applied with the memory cell inhibited from programming. After applying the second program pulse, the system again verifies the memory cell for the low verify level VL and the high verify level VH. The memory cell undergoes a downshift in threshold voltage to a level below the low verify level VL after the temporary lockout. In response, the system applies the third program pulse without inhibiting the memory cell from being programmed. The system verifies the memory cell at VL and VH following the third program pulse. The memory cell passes verification at VH following the third program pulse. The system permanently locks out the memory cell from programming by additional program pulses during the current programming phase.

Figure 16:
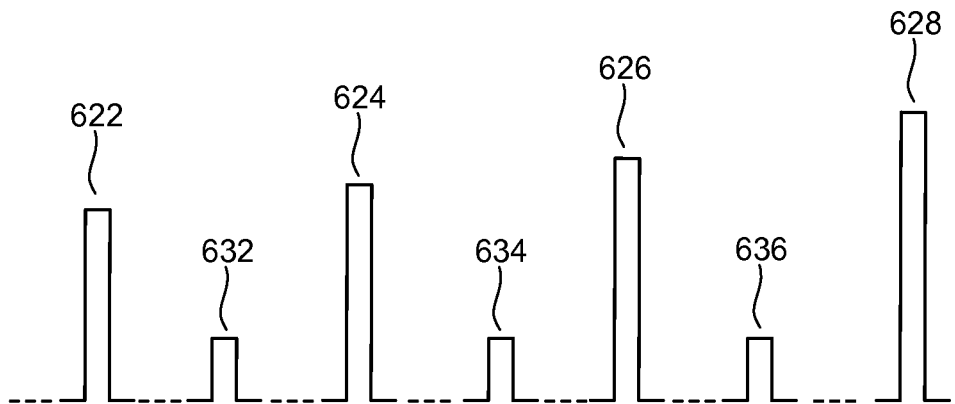
FIG. 16 is a diagram describing the examples of memory cells from FIG. 15.

FIG. 16 is a diagram describing the examples of memory cells from FIG. 15 being programmed using a double lockout mode of programming according to one embodiment. FIG. 16 shows an example waveform that is applied to a selected word line along with the behavior of the four memory cells. Each of the four memory cells may represent a group or a plurality of memory cells. The waveform of FIG. 16 shows programming pulses 622, 624, 626, and 628. The programming pulses increase in magnitude with each successive pulse. The waveform also shows verification pulses 632, 634, and 636. Each of the verification pulses correspond to the same data state and therefore do not increase in magnitude. The ellipses between the program pulses and verification pulses indicate that there may be and likely will be multiple verification pulses between each program pulse, for the different data states that the memory cells along the selected word line may be programmed to. A single data state for programming memory cells #1-#6 is shown by way of example.

Each row of boxes describes the behavior of the corresponding memory cell during the pulse above the respective box. During program pulse 1102, all of the memory cells #1-#6 are enabled for full programming at a first rate. For example, the bit lines for each of the memory cells may receive a first enable voltage (e.g., 0V) to enable a full programming rate for each of the memory cells when program pulse 1102 is applied. One or more verify pulses are then applied (e.g., at the magnitude of verify pulse 1120) to verify each of the memory cells for the low verify level VL and the high verify level VH for the target data state.

For memory cells #1, #2, and #5, the system determines that the memory cells have a threshold voltage above the low verify level VL but below the high verify level VH. For memory cells #3, #4, and #6, the system determines that the memory cells have a threshold voltage above the high verify level VH. In response to determining that these cells have passed one of the verify levels for the target data state, the system temporarily locks out the cells from programming.

During programming pulse 624, memory cells #1-#6 are inhibited from programming due to their temporary lockout condition. In one embodiment, an inhibit voltage (e.g., Vinhibit=2.2V) can be applied to the bit line for a corresponding bit line to inhibit the memory cell from being programmed during application of the program pulse 624. This larger bit line voltage will result in the memory cells not undergoing programming even though the program pulse is applied to their corresponding word line.

One or more verify pulses 634 are then applied to again verify each of the memory cells for the low verify level VL and the high verify level VH for the target data state. For memory cells #5 and #6, the system determines that the corresponding threshold voltages are below low verify level VL following the temporary lockout. In response, the system enables these cells for programming during the next program pulse. In this example, each of the cells will be programmed at a second programming rate (rate 2). The second programming rate is less than the first rate of programming applied to cells that have not been temporarily locked out. Because the cells have been temporarily locked out and have therefore skipped a program pulse, the system uses a reduced rate of programming to avoid overprogramming these memory cells during the next program pulse which will have been increased twice since these cells were last programmed. The second rate may nevertheless be a somewhat rapid rate of programming as these cells are determined to be far from their final target levels. In one embodiment, the system applies a second enable voltage to the bit lines for memory cells #5 and #6 to enable the second rate of programming. The second enable voltage (e.g., 0.5V)

to enable the second rate of programming can be higher than the enable voltage (e.g., 0V) applied to enable the first rate of programming.

For memory cells #2 and #4, the system determines that the corresponding threshold voltages are above the low verify level VL but below the high verify level VH. In response to determining that these cells have passed the low verify level for the target data state but not the high verify level following a temporary lockout, the system enables these cells for programming during the next program pulse. In this example, each of the cells will be programmed at a third programming rate (rate 3). The third programming rate is less than the first rate of programming applied to cells that have not been temporarily locked out and the second rate of programming applied to cells that have been temporarily locked out but are below the low verify level VL. Accordingly, during program pulse 626, a third enable voltage (e.g., 1.0V) that is higher than the second enable voltage (e.g., 0.5V) is applied to the bit lines of these memory cells so that they are programmed at the third programming rate.

For memory cells #1 and #3, the system determines that their threshold voltages are above the high verify level VH. In response, the system permanently locks out these cells from programming during the current programming stage. For example, the system may update a lockout latch or register for the bit line of each cell so that an inhibit voltage is applied to the bit lines of these cells during subsequent program pulses. Accordingly, during program pulse 626 and 628, the inhibit voltage (e.g., Vinhibit=2.2V) is applied to the bit lines of these memory cells so that they are not programmed when the program pulse is applied to their shared word line.

After the third program pulse 626, one or more verify pulses 636 are applied to again verify each of the memory cells for the low verify level VL and the high verify level VH for the target data state. The system determines that the threshold voltages of cells #2, #4, #5, and #6 are above the high verify level VH. In response to determining that these cells have passed the high verify level, the system permanently locks out these cells from programming during the current programming phase. Accordingly, during program pulse 628, and 1110, the inhibit voltage (e.g., Vinhibit=2.2V) is applied to the bit lines of these memory cells so that they are not programmed when the program pulse is applied to their shared word line.

FIG. 17 is a table describing a double lockout mode of programming in accordance with an embodiment of the disclosure. The lefthand column denotes 64 cell types which represent 64 possible programming statuses for which different memory cells may be placed for programming to seven states (A-G) using a double lockout mode with two programming phases. The second column denotes the state for each cell type. The third and fourth columns show the result of verification prior to a temporary lockout condition and the fifth and sixth columns show the result of verification for the latest programming pulse that has been applied after the temporary lockout condition has been instituted for a memory cell. The final column on the right shows the treatment that will be applied to the memory cell for the next program pulse Vpgm. The treatment in the described example is a bit line voltage but other treatments may be applied such as directly controlling the channel voltage for a memory cell.

It is noted that VL1 and VH1 refer to the result of verification at the low verify level and the high verify level for the target data state during the temporary lockout phase. That is, these are the results of the verification at VL and VH prior to a memory cell being temporarily locked from programming. VL2 and VH2 refer to the result of verification at the low verify level and the high verify level for the target data state during the permanent lockout phase. That is, these are the results of the verification at VL and VH after a memory cell has been temporarily locked from programming and is being verified again at the verify levels for its target data state.

For the first cell type, column 2 indicates that the memory cell is being programmed to state A. Column 3 indicates that the memory cell has failed verification at the low verify level VL for state A. Column 4 indicates that the memory cell has also failed verification at the high verify level VH for state A. Column 4 also shows that the verification status at the high level may be ignored when the memory cell fails verification at VL since a low programming condition has already been detected such that the cell will be enabled for additional programming. Columns 5 and 6 indicate that the verification data following temporary lockout for memory cell 1 is not available. This condition exists because the memory cell has not passed verification a first time at VL or VH such that the memory cell has not been temporarily locked out. Because memory cell 1 has not reached the low verify level for state A, it is enabled for full programming (e.g., rate 1) during the next programming pulse of the pulse train. Column 7 indicates that the bit line of memory cell 1 receives a voltage Venable1 (e.g., 0V) so that memory cell 1 is fully programmed at the fastest rate during the next program pulse Vpgm.

For the second cell type (memory cell 2), column 3 indicates that the memory cell has passed verification at the low verify level VL and column 4 indicates that the memory cell has failed verification at the high verify level VH. Like memory cell 1, memory cell 2 has not undergone temporary lockout so the data for columns 5 and 6 is not available. Column 7 indicates that the bit line of memory cell 2 receives an inhibit voltage Vinhibit (e.g., 2.2V) so that memory cell 2 is not programmed during the next program pulse Vpgm.

For the third cell type (memory cell 3) being programmed to state A, column 3 indicates that the memory cell has passed verification at the low verify level VL and column 4 indicates that the memory cell has failed verification at the high verify level VH. Data is provided for columns 5 and 6 indicating that the third memory cell has been temporarily locked out during an earlier program pulse. This indicates that the memory cell has been previously verified at the low verify level VL and/or the high verify level VH. Accordingly, the system determines the appropriate memory cell treatment for the memory cell following its having been locked out from programming during application of a previous program pulse. For memory cell 4, columns 5 and 6 indicate that the memory cell has failed verification at both the low verify level VL and the high verify level VH. Similar to memory cell 1 before temporary lockout, if the cell fails verification at the low verify level VL after temporary lockout, it need not be verified for the high verify level VH, although it can. Because memory cell 3 has failed the low level verification at VL, it is enabled for programming during the next program pulse. In this embodiment, an enable voltage Venable2 is applied to the bit line for memory cell 3. The second enable voltage Venable2 is higher than the first enable voltage Venable1, but lower than the inhibit voltage Vinhibit. The higher voltage applied to the bit line will reduce the rate of programming from the full rate applied for memory cell type 1. A relatively low level enable voltage can be used so as to not overly slow the memory cell from programming. The failed verification at the low level indicates that the cell is far from its target level, but the original verification before temporary lockout indicates that the cell is likely programmed to a relatively high level. Accordingly, Venable2 can be used to program the memory cell significantly, but not overly slow.

For the fourth cell type (memory cell 4), column 3 indicates that the memory cell has passed verification at the low verify level VL and column 4 indicates that the memory cell has failed verification at the high verify level VH. Data is provided for columns 5 and 6 indicating that the third memory cell has been temporarily locked out during an earlier program pulse. Column 5 indicates that the memory cell has passed verification at the low verify level VL and column 6 indicates that it has failed verification at the high verify level VH. Because memory cell 4 has failed the high level verification at VH, it is enabled for programming during the next program pulse. In this embodiment, an enable voltage Venable3 is applied to the bit line for memory cell 4. The third enable voltage Venable3 (e.g., 1.0V) is higher than the first and second enable voltages Venable1 and Venable2, but is lower than the inhibit voltage Vinhibit. Because the enable voltage is even higher than the second enable voltage, it will further reduce the rate of programming from the first reduced rate applied for memory cell type 3. The passed verification at the low level indicates that the cell is close to its target level. Accordingly, Venable3 can be used to program the memory cell at a relatively slow rate to precisely program it near the final verify level VH.

For the fifth cell type (memory cell 5), column 3 indicates that the memory cell has passed verification at the low verify level VL and column 4 indicates that the memory cell has failed verification at the high verify level VH. Column 6 indicates that the memory cell has passed verification at the high low verify level VL following temporary lockout. Column 5 indicates that the cell has passed verification at the high verify level VL. Column 5 also indicates that the condition is a "not care" status indicating since the passed verification at VH has been determined, the low level verification data is not needed. Because memory cell 5 has passed the high level verification at VH, it is inhibited for programming during the next program pulse. The inhibit voltage Vinhibit (e.g., 2.2V) can be applied to the bit line for memory cell 5 so that it is not programmed during the subsequent program pulse. As noted elsewhere, when the memory cell passes verification at the high verify level VH after previously being locked out, it can be permanently locked out. A data latch may be updated following a passed verification following earlier lockout so that the memory cell is not verified for subsequent program pulses and is inhibited permanently for the current programming phase. For example, the memory cell may be locked out for all pulses of the pulse train following verification at VH after an earlier temporary lockout.

For the sixth cell type (memory cell 6), column 3 indicates that the memory cell has passed verification at the low verify level VL and column 4 indicates that the memory cell has passed verification at the high verify level VH. Like memory cells 1 and 2, memory cell 6 has not undergone temporary lockout so the data for columns 5 and 6 is not available. Column 7 indicates that the bit line of memory cell 6 receives an inhibit voltage Vinhibit (e.g., 2.2V) so that memory cell 6 is not programmed during the next program pulse Vpgm(n+1).

For the seventh cell type (memory cell 7), column 3 indicates that the memory cell has passed verification at the low verify level VL and column 4 indicates that the memory cell has passed verification at the high verify level VH. Data is provided for columns 5 and 6 indicating that the third memory cell has been temporarily locked out during an earlier program pulse. Columns 5 and 6 indicate that the memory cell has failed verification at both the low verify level VL and the high verify level VH. In this embodiment, an enable voltage Venable2 is applied to the bit line for memory cell 3 because it is below the low verify level.

For the eighth cell type (memory cell 8), column 3 indicates that the memory cell has passed verification at the low verify level VL and column 4 indicates that the memory cell has passed verification at the high verify level VH. Columns 5 and 6 indicate that the memory cell has passed verification at the low verify level VL but has failed verification and the high verify level VH following an earlier lockout. In this embodiment, an enable voltage Venable3 is applied to the bit line for memory cell 3 because it is above the low verify level.

For the ninth cell type (memory cell 9), columns 3 and 4 indicate that the memory cell has passed verification at the low and high verify levels prior to temporary lockout. Column 6 indicates that the memory cell has passed verification at the high verify level VH. Column 5 indicates a pass or "don't care" condition for the low verify level. Because memory cell 9 has passed the high level verification at VH, it is inhibited for programming during the next program pulse by applying the bit line voltage Vinhibit (e.g., 2.2V). Memory cell 9 can be permanently locked out by updating a data latch so that the memory cell is not verified for subsequent program pulses and is inhibited permanently for the current programming phase.

Memory cell types 10-63 for states B-G undergo the same programming status assignments as with the memory cell types for state A. In this manner, memory cells are programmed to all target data states by programming to at least a low verify level for the respective target data state. The cells are temporary locked-out and then verified for both the low verify level and a high or final verify level for their respective target data states. The memory cells can be programmed further if they fail verification at their low and/or high verify levels. At least three rates of programming in addition to an inhibit condition are used in one embodiment based on the various histories and current conditions of different cell types. The final row in the table indicates that a memory cell that is to remain in the erased states receives the inhibit voltage Vinhibit at its bit line during all program pulses.

FIG. 18 is a table showing the possible cases or distinctions between various memory cell types in a 3-bit per cell implementation using a double lockout programming mode. The top row indicates the different programming levels to be discriminated as well as when a cell is to be locked out for a programming pulse. The total number of cases are indicated as well as the number of latches that can be used to track or otherwise store the data for the total number of cases.

The left column sets forth the conditions of an overall programming process, noting the times during which programming is performed all states. The "no lockout" row indicates how many cases are to be discriminated when all 7 states are being programmed along a word line. In this row, it is noted that for all states A-G across all cells, data is to be stored indicating whether various cells have verified at the low verify levels and high verify levels prior to temporary lockout (e.g, AL1 and AH1) as well as the low verify levels and the high verify levels following a temporary lockout (e.g., AL2 and AH2). Across the seven states, this provides for 28 possible cases or scenarios. Additionally, the system needs to track for some cells that they are to be locked out for a programming pulse. This represents a 29th case when all of the memory states are currently undergoing sensing. Using binary latches, the total number of latches required to track these cases is 5 ($2^5=32$).

The "A finished" row indicates how many cases are to be discriminated when all cells of the word line to be programmed to the A-state have completed programming. In this row, it is noted that for all state A, discrimination at the low and high verify levels (e.g., AL1, AH1) prior to temporary lockout or the low and high verify levels after temporary lockout (e.g., AL2, AH2) does not need to be tracked. Across the remaining six, this provides for 24 possible cases. Additionally, the lockout case needs to be tracked resulting in a total of 25 cases. Using binary latches, the total number of latches required to track these cases is 5 ($2^5=32$).

The "B finished" row indicates how many cases are to be discriminated when all cells of the word line to be programmed to the A-states and B-states have completed programming. In this row, it is noted that for states A and B, discrimination at the low (AL1, BL1) and high verify levels (AH1, BH1) prior to temporary lockout or the low (AL2, BL2) and high verify levels (AH2, BH2) after temporary lockout do not need to be tracked. Across the remaining five states, this provides for 20 possible cases which with the addition of the lockout case results in 21 possible cases. Using binary latches, the total number of latches required to track these cases is 5 ($2^5=32$).

The "C finished" row indicates how many cases are to be discriminated when all cells of the word line to be programmed to the A-state, B-state, and C-state have completed programming. In this row, it is noted that for states A, B, and C discrimination at the low (AL1, BL1, CL1) and high verify levels (AH1, BH1, CH1) prior to temporary lockout or the low (AL2, BL2, CL2) and high verify levels (AH2, BH2, CH2) after temporary lockout do not need to be tracked. Across the remaining four states, this provides for 16 possible cases which with the addition of the lockout case results in 17 possible cases. Using binary latches, the total number of latches required to track these cases is 5 ($2^5=32$).

The "D finished" row indicates how many cases are to be discriminated when all cells of the word line to be programmed to the A-state, B-state, C-state, and D-state have completed programming. In this row, it is noted that for states A, B, C, and D discrimination at the low (AL1, BL1, CL1, DL1) and high verify levels (AH1, BH1, CH1, DH1) prior to temporary lockout or the low (AL2, BL2, CL2, DL2) and high verify levels (AH2, BH2, CH2, DH2) after temporary lockout do not need to be tracked. Across the remaining four states, this provides for 12 possible cases which with the addition of the lockout case results in 13 possible cases. Using binary latches, the total number of latches required to track these cases is 4 ($2^4=16$).

The "E finished" row indicates how many cases are to be discriminated when all cells of the word line to be programmed to the A-state, B-state, C-state, D-state, and E-state have completed programming. In this row, it is noted that for states A, B, C, D, and E discrimination at the low (AL1, BL1, CL1, DL1, EL1) and high verify levels (AH1, BH1, CH1, DH1, EH1) prior to temporary lockout or the low (AL2, BL2, CL2, DL2, EL2) and high verify levels (AH2, BH2, CH2, DH2, EH2) after temporary lockout do not need to be tracked. Across the remaining four states, this provides for 8 possible cases which with the addition of the lockout case results in 9 possible cases. Using binary latches, the total number of latches required to track these cases is 4 ($2^4=16$).

The "F finished" row indicates how many cases are to be discriminated when all cells of the word line to be programmed to the A-state, B-state, C-state, D-state, E-state, and F-state have completed programming. In this row, it is noted that for states A, B, C, D, E, and F discrimination at the low (AL1, BL1, CL1, DL1, EL1, FL1) and high verify levels (AH1, BH1, CH1, DH1, EH1, FH1) prior to temporary lockout or the low (AL2, BL2, CL2, DL2, EL2, FL2) and high verify levels (AH2, BH2, CH2, DH2, EH2, FH2) after temporary lockout do not need to be tracked. Across the remaining four states, this provides for 4 possible cases which with the addition of the lockout case results in 5 possible cases. Using binary latches, the total number of latches required to track these cases is 3 ($2^3=8$).

The "G finished" row indicates how many cases are to be discriminated when all cells of the word line to be programmed to the A-state, B-state, C-state, D-state, E-state, F-state, and G-state have completed programming. In this row, it is noted that discrimination at none of the verify levels before or after temporary lockout need to be tracked. The lockout case results in 1 possible case which can be tracked using a single data latch.

As earlier described, a memory cell may be temporarily locked out from programming if it passes verification at VL or VH during the temporary lockout phase. Accordingly, whether the cell is above AH1, for example, can be considered the same case as whether the cell is above AL1. If data for both sensings is not stored, the number of cases can be reduced from 29 to 22, for example.

In one embodiment, the two programming rates during the permanent lockout phase can be reduced to one to reduce the cases from 29 to 22. For example, sensing at only the high level may be performed during the permanent lockout phase such that AL2 and AH2 are the same case, etc. A memory cell can be programmed at the second rate or third programming rate throughout programming during the permanent lockout phase without respect to whether it is above or below verify level VL.

Figure 19:
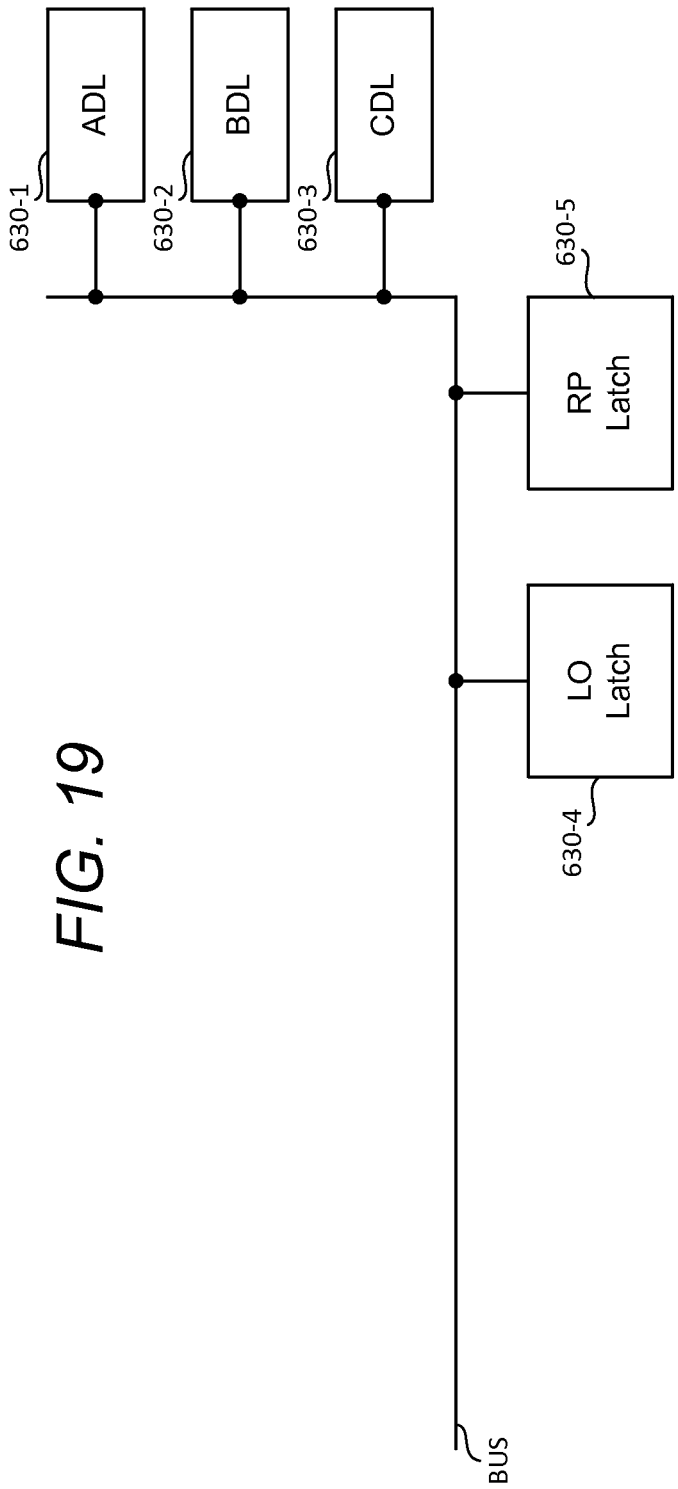
FIG. 19 is a block diagram describing a set of data latches for implementing a double lockout mode.

FIG. 19 is a block diagram describing a set of data latches for implementing a double lockout mode of programming where memory cells are configured to store 3-bits per cell across eight data states. Three data latches DL1, DL2, and DL3 are provided for storing each of the three data bits to be programmed into a memory cell. More or fewer data latches may be used based on the number of bits in a given implementation. Data latches DL1-DL3 are used during verification to determine for a given memory cell, which state should be evaluated to determine what status the memory cell should be assigned. For example, the state-A verify levels will be evaluated for the memory cell if the data latches DL1-DL3 indicate that the memory cell is to be programmed to state A.

Additionally, a lockout out LO latch and a reduced programming (RP) latch are provided. The LO latch stores a first binary value (e.g., logic '0') that indicates that the corresponding bit line should be programmed during the next program pulse and a second binary value (e.g., logic '1') that indicates that the corresponding bit line is locked-out and therefore should be inhibited during the next program pulse. A RP data latch is provided to adjust the rate of programming for a given memory cell during programming. In a simple programming process, a first binary value (e.g., logic '0') may be used to indicate that the memory cell has not verified at the low verify level for the target state and therefore should be enabled for full programming (rate 1) during the next program pulse. A second binary value (e.g., logic '1') may be used to indicate the memory cell has verified at the low verify level for the target state and therefore should be enabled for reduced programming (e.g., rate 2) during the next program pulse.

Where double lockout programming is used, various combinations of the latches may be used to control the different rates of programming that are used. For example, the LO latch may be set to logic '0' and the RP latch may be set to logic '0' to indicate that the corresponding memory cell should be enabled for full programming during a next program pulse. This is used to indicate that a memory cell has not passed verification at the low or high verify level a first time and thus, has not undergone a temporary lockout. When the memory cell verifies at the low or high verify level for its target state a first time during the temporary lockout stage, the QPW latch can be set to logic '1' in combination with the LO latch remaining at logic '0.' In response, the system will apply Vinhibit to the corresponding bit line to inhibit programming during the next program pulse.

After temporary lockout, the memory cell is verified again for the low verify level and the high verify level. The LO latch is set to logic '1' to indicate that the memory cell has already undergone a temporary lockout. If the memory cell is not verified at the low verify level after temporary lockout, then the QPW latch is set to logic '0' to indicate that the memory cell is below the low verify level. In response, the system programs the memory cell at the second (reduced) rate of programming for the next program pulse. Venable2 may be applied to the corresponding bit line. If the memory cell is verified at the low verify level but not the high verify level after temporary lockout, the RP latch is set to logic '1.' In response, the system will program the memory cell at the third (reduced) rate of programming for the next program pulse. Venable3 may be applied to the corresponding bit line. If the memory cell is verified at the high verify level after temporary lockout, the system flips the data in the data latches DL1-DL3 to indicate the erased state so that the memory cell is permanently locked out from additional programming during the pulse train for the current program phase.' In response, the system will apply Vinhibit to the bit line of the memory cell for each subsequent program pulse.

Figure 20:
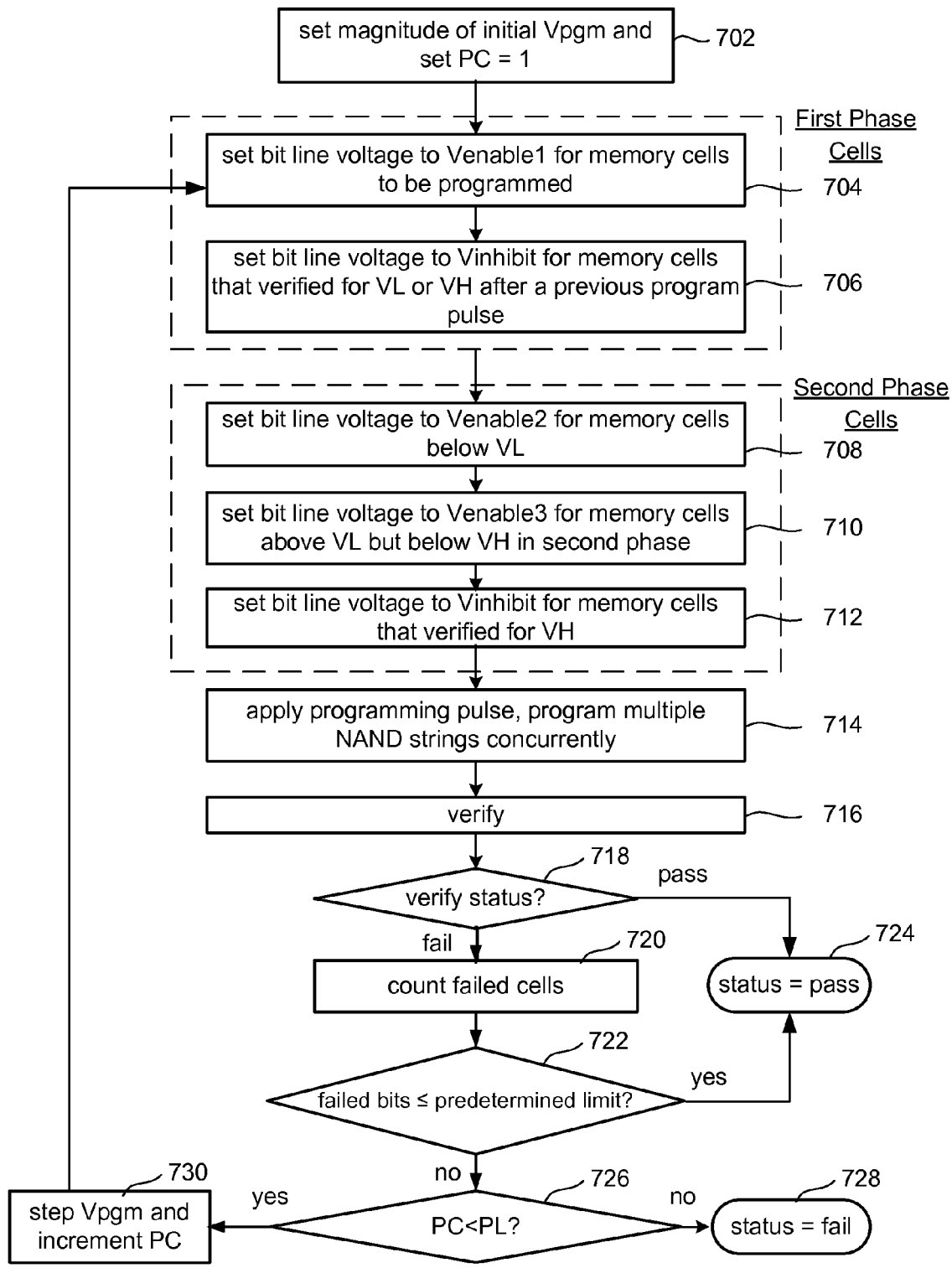
FIG. 20 is a flow chart describing one embodiment of a process for programming.

FIG. 20 is a flow chart describing one embodiment of a process for performing programming of memory cells connected to a common word line to one or more target data states. The process of FIG. 20 can be performed one or multiple times to program data to a set of memory cells. For example, the process of FIG. 20 can be used to program memory cells from S0 to any of S1-S7 in the full sequence programming of FIG. 8. The process of FIG. 20 can also be used to program memory cells for any of the three phases of FIGS. 10A-10E.

At step 702, the programming voltage (Vpgm) is initialized to the starting magnitude (e.g., ~12-16V or another suitable level) and a program counter PC maintained by state machine 112 is initialized at 1. Steps 704-706 are performed for memory cells that are currently in the first stage of programming for their target data states. These memory cells have not previously passed verification at any level for their target state. In one embodiment, the system may access a LO latch which will store a first logic value to indicate the temporary lockout phase and a second logic value to indicate the permanent lockout phase.

At step 704, the bit line voltage for memory cells in the first stage that are to be programmed is set to Venable1. Venable1 is a bit line voltage that allows for full programming (rate 1) in the first phase. In one embodiment, Venable1 is 0 v. At step 706, the bit line voltage for memory cells in the first phase that are to be inhibited from program is set to Vinhibit. Vinhibit is used for memory cells that have passed verification at the low or high verify level during the first phase and will be temporarily locked out from programming. In one embodiment, Vinhibit is set at Vdd, which is typically 2.2-5 v.

Steps 708-712 are performed for memory cells that are currently in the second phase of programming for their target data states. These memory cells have previously passed verification at either the low or high verify level for the target state and have been temporarily locked out from programming for one or more program pulses for the current program process. At step 708, the bit line voltage for memory cells in the second phase that fail verification for the low verify level VL are set to Venable2. At step 710, the bit line voltage for memory cells in the second phase that fail verification for the high verify level VH but pass verification for the low verify level VL are set to Venable3. At step 712, the bit line voltage for memory cells in the second phase that pass verification for the high verify level VH are set to Vinhibit. Venable2 is a bit line voltage that allows for reduced programming at a second rate slower than the first programming rate. Venable3 is a bit line voltage that allows for reduced programming a third rate that is slower than the second programming rate.

At step 714, the programming pulse is concurrently applied to all memory cells connected to the selected word line so that all of the memory cells connected to the selected word line are potentially programmed concurrently. The memory cells are programmed at the same time or during overlapping times (both of which are considered concurrent). In this manner all of the memory cells connected to the selected word line will concurrently have their threshold voltage change, unless they have been inhibited from programming. The unselected word lines receive one or more boosting voltages (e.g., ~7-11 volts) to perform boosting schemes known in the art.

At step 716, the appropriate memory cells are verified using the appropriate set of target levels to perform one or more verify operations. At step 718, it is determined whether all the memory cells have reached their target threshold voltages (pass). If so, the programming process is complete and successful because all selected memory cells were programmed and verified to their target states. A status of "PASS" is reported at step 724. If, at step 718, it is determined that not all of the memory cells have reached their target threshold voltages (fail), the programming process continues.

At step 720, the system counts the number of memory cells that have not yet reached their respective target threshold voltage distribution. The system counts the number of memory cells that have failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state. In step 722, it is determined whether the count from step 720 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 724. In this situation, enough memory cells programmed correctly such that the few remaining memory cells that have not been completely programmed can be corrected using ECC during the read process. In some embodiments, step 720 will count the number of failed cells for each sector, each target data state or other unit, and those counts will individually or collectively be compared to a threshold in step 722. In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 726 and the program counter PC is checked against the program limit value (PL). Examples of program limit values include 20 and 30; however, other values can be used. If the program counter PC is not less than the program limit value PL, then the program process is considered to have failed and a status of FAIL is reported in step 728. If the program counter PC is less than the program limit value PL, then the process continues at step 730 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 730, the process loops back to step 704 so that the bit lines can be set and another program pulse is applied to the selected word line.

The process of FIG. 20 can be performed at the direction of state machine 112 and/or controller 122. For example, in one embodiment, state machine 112 (or controller 122) will direct decoders 114/124/132, power control module 116, sense blocks SB1, SB2, . . . , SBp, and read/write circuits 128 to perform the functions described in FIG. 20.

Figure 21:
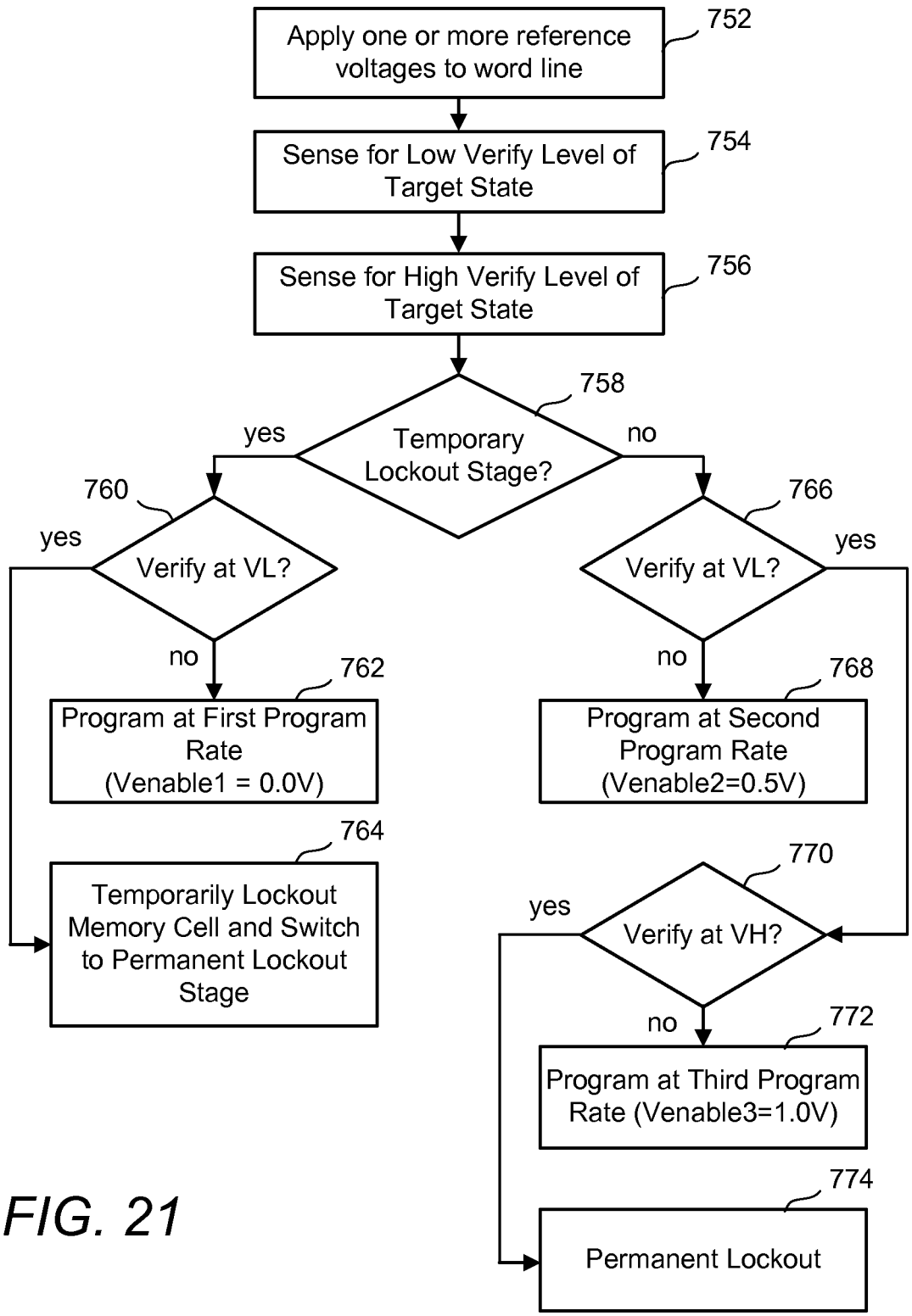
FIG. 21 is a flow chart describing one embodiment of a verification process performed for a memory cell.

FIG. 21 is a flow chart describing one embodiment of a verification process performed for a memory cell. In one embodiment, the process of FIG. 21 is performed for each memory cell being verified during step 716 of FIG. 20.

At step 752, the appropriate reference voltage for a target data state N is applied to the word line. At step 754, sensing is performed at the low verify level VL corresponding to the target data state. At step 756, sensing is performed at the high verify level VH. Sensing at the low verify level VL may be performed by applying VL to the word line and sensing at the high verify level VH may be performed by applying VH to the word line. Alternatively, sensing at the low verify level VL may be performed by applying VH to the word line and sensing using a shorter strobe time than is used for sensing at VH. Sensing may also include applying VH to the selected word line and using a lower bit line voltage to sense at the low verify level VL than the bit line voltage that is used to sense at the high verify level. Combinations of these or other techniques may be used. At step 758, the system determines whether the memory cell is currently in the temporary lockout stage or the permanent lockout stage. If the memory cell is in the temporary lockout stage, the system determines whether the memory cell passes verification at the low verify level at step 760. If the memory cell does not pass verification at the low verify level, the system enables full programming of the memory cell for the next program pulse at step 762. If the memory cell passes verification at VL, the system temporarily locks out the memory cell from programming for the next program pulse at step 764. The system temporarily inhibits programming for the memory cell for the next program pulse. The system may also update one or more data latches to indicate that the cell should be temporarily inhibited and is subsequently in the permanent lockout stage.

If the memory cell is in the permanent lockout stage, the system determines whether the memory cell passes verification at the low verify level VL at step 766 and the high verify level VH at step 770. If the memory cell fails verification at the low verify level VL, the system enables the memory cell for programming at the second rate at step 768. If the memory cell passes verification for the low verify level VL but not the high verify level VH, the system enables the memory cell for programming at the third rate at step 772. If the memory cells passes verification for the high verify level, the system permanently locks the memory cell out from programming during the current programming stage at step 774. The system may update the data latches for the memory cell to indicate the erased state in response to the memory cell passing verification at the high verify level while in the permanent lockout phase. Note that permanently locked out refers to the current programming stage. The block of memory cells can be programmed again for other programming phases and may also be erased and programmed again with new user data.

Figure 22:
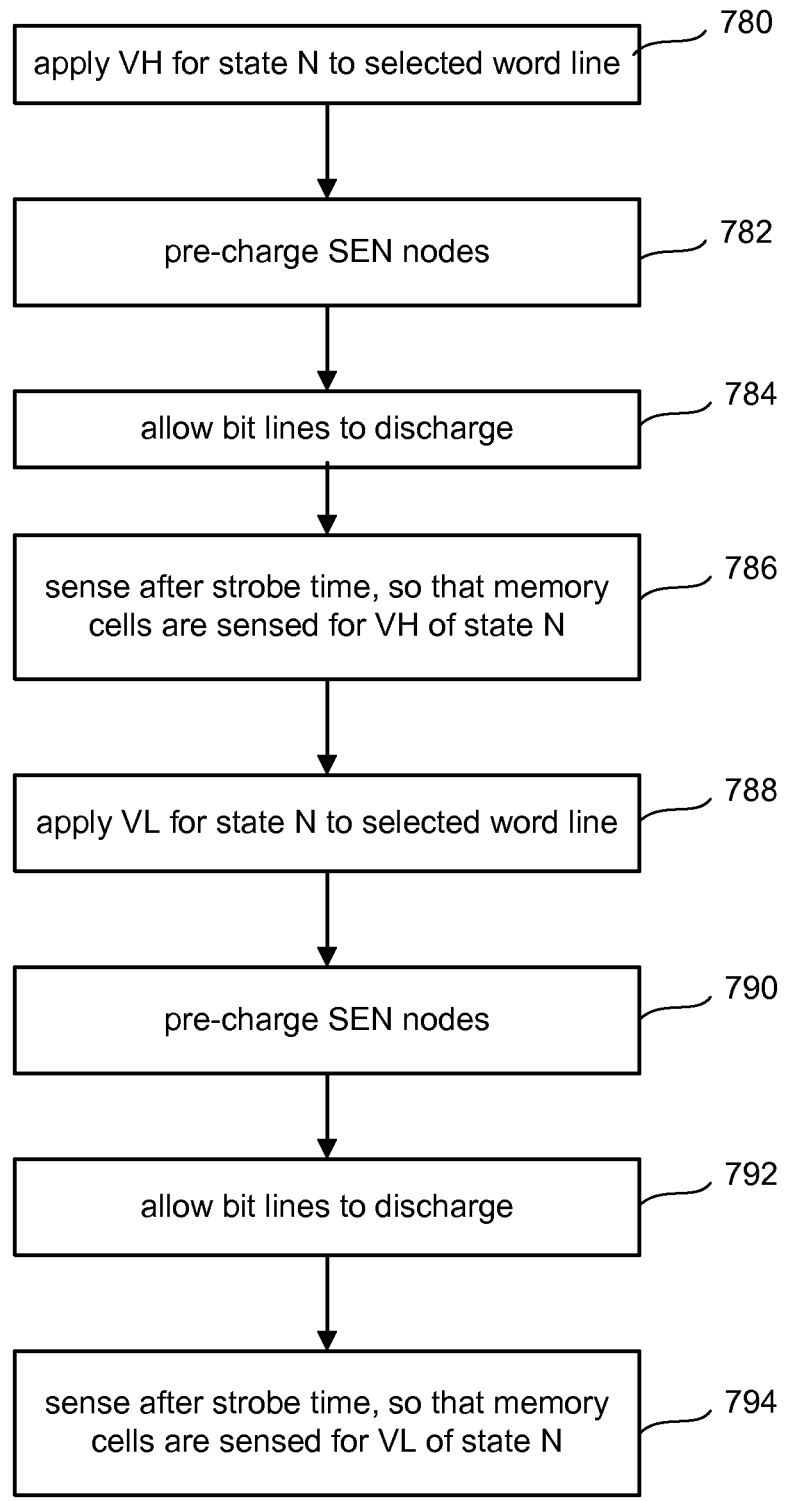
FIG. 22 is a flow chart describing a double strobe sensing operation that uses two reference voltages for the selected word line.

FIG. 22 is a flow chart describing a double strobe sensing operation that uses two reference voltages for the selected word line to sense at the low verify level and the high verify level for each of the target data states during a program verification operation. In one embodiment, the process of FIG. 22 can be used to perform sensing at the low and high verify levels at steps 754 and 756 in FIG. 21. The process of FIG. 21 provides further details of one or more control circuits sensing whether different memory cells have reached different verify levels by applying different reference word line voltages. The process of FIG. 21 relates to the operation of the circuit of FIG. 5. At step 780, the appropriate data state N high level verify reference voltage VH is applied to the selected word line (also referred to elsewhere in this document as the common word line). The selected word line is connected to the memory cells being programmed and verified. At step 782, all of the SEN nodes of the sense amplifiers connected to the memory cells being verified are simultaneously pre-charged, as discussed above. At step 784, the SEN nodes and capacitors 516 of the sense amplifiers are allowed to discharge, for example, by discharging through the memory cells, as discussed above. At step 786, after a predetermined time period, referred to as the "strobe time," the voltage of the capacitor 516 (or the SEN node) is sampled as described above to determine whether the respective memory cell(s) conducted and are thereby sensed for VH of state N.

At step 788, the appropriate data state N low level verify reference voltage VL is applied to the selected word line. At step 756, all of the SEN nodes of the sense amplifiers connected to the memory cells being verified are simultaneously pre-charged, as discussed above. In step 758, the SEN nodes and capacitors 516 of the sense amplifiers are allowed to discharge. In step 760, after the predetermined strobe time period, the voltage of the capacitor 516 (or the SEN node) is sampled as described above to determine whether the respective memory cell(s) conducted and are thereby sensed for VL of state N. As described above, the verification process is performed simultaneously for thousands of memory cells connected to the same word line and different bit lines.

Figure 23:
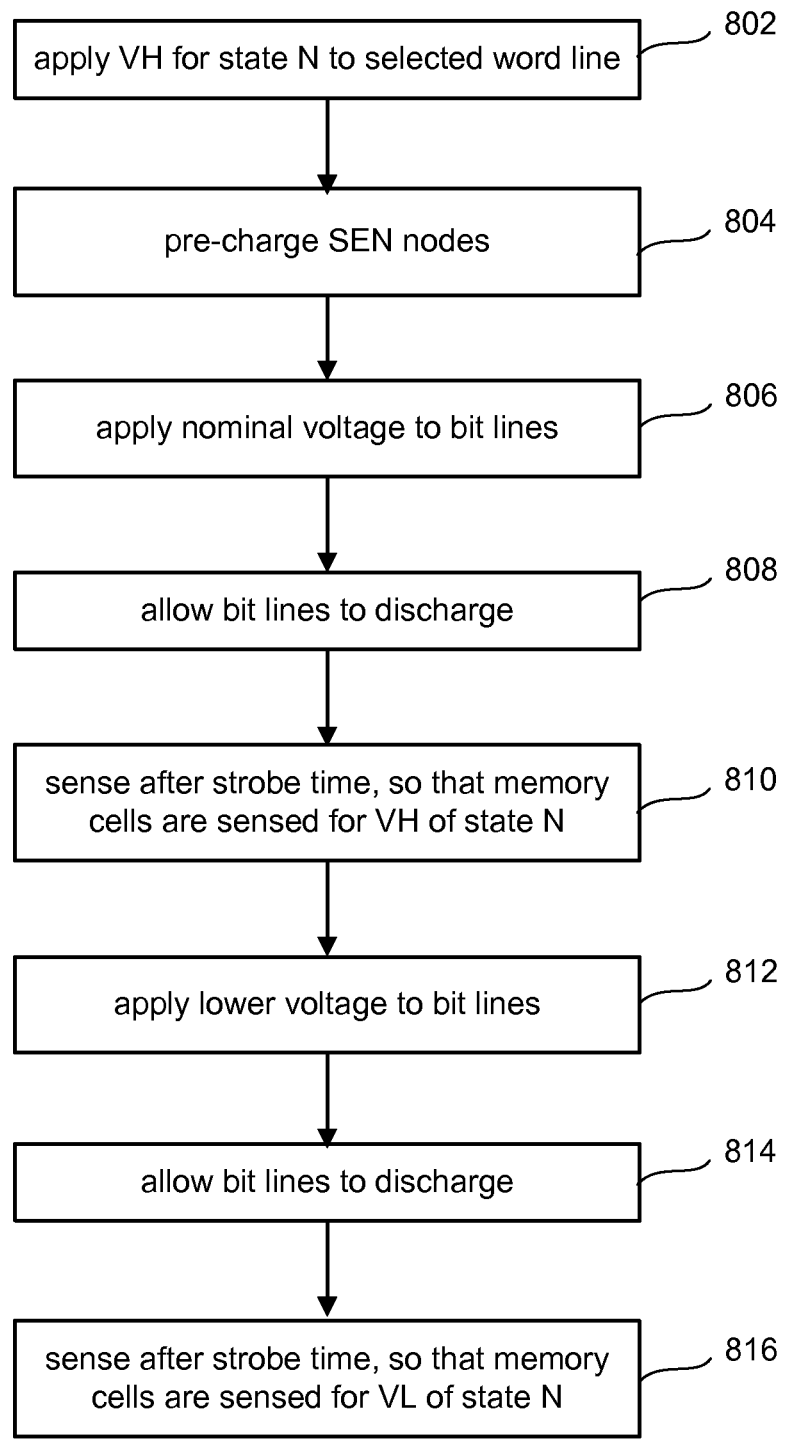
FIG. 23 is a flow chart describing a single strobe sensing operation using multiple bit line voltages.

FIG. 23 is a flow chart describing a single strobe sensing operation that can be performed for each of the target data states during a program verification operation. In one embodiment, the process of FIG. 23 can be used to perform sensing at the low and high verify levels at steps 754 and 756 in FIG. 21. The process of FIG. 23 provides further details of one or more control circuits sensing whether different memory cells have reached different verify levels for a data state in response to the same reference voltage by applying different bit line voltages to the memory cells. At step 802, the appropriate data state N verify reference voltage VH is applied to the selected word line. At step 804, all of the SEN nodes of the sense amplifiers connected to the memory cells being verified are simultaneously pre-charged, as discussed above. At step 806, the nominal bit line voltage (e.g., 0.7 volts) is applied to the bit lines connected to the memory cells.

At step 808, the SEN nodes and capacitors 516 of the sense amplifiers are allowed to discharge, for example, by discharging through the memory cells, as discussed above. At step 810, after the strobe time, the voltage of the capacitor 516 (or the SEN node) is sampled as described above to determine whether the respective memory cell(s) conducted so that the memory cells connected to bit lines at nominal voltage are sensed for VH of state N.

At step 812, a voltage that is lower than the nominal bit line voltage is applied to the bit lines connected to the memory cells. At step 814, the SEN nodes and capacitors 516 of the sense amplifiers are allowed to discharge. In this embodiment, the SEN nodes are not pre-charged between discharging at step 808 and step 814. In another embodiment, the SEN nodes are pre-charged again before the discharge at step 814.

At step 816, the voltage of the capacitor 516 (or the SEN node) is sampled again to determine whether the respective memory cell(s) conducted so that the memory cells connected to the bit lines are sensed for VL of state N. As described above, the verification process is performed simultaneously for thousands of memory cells connected to the same word line and different bit lines.

Figure 24:
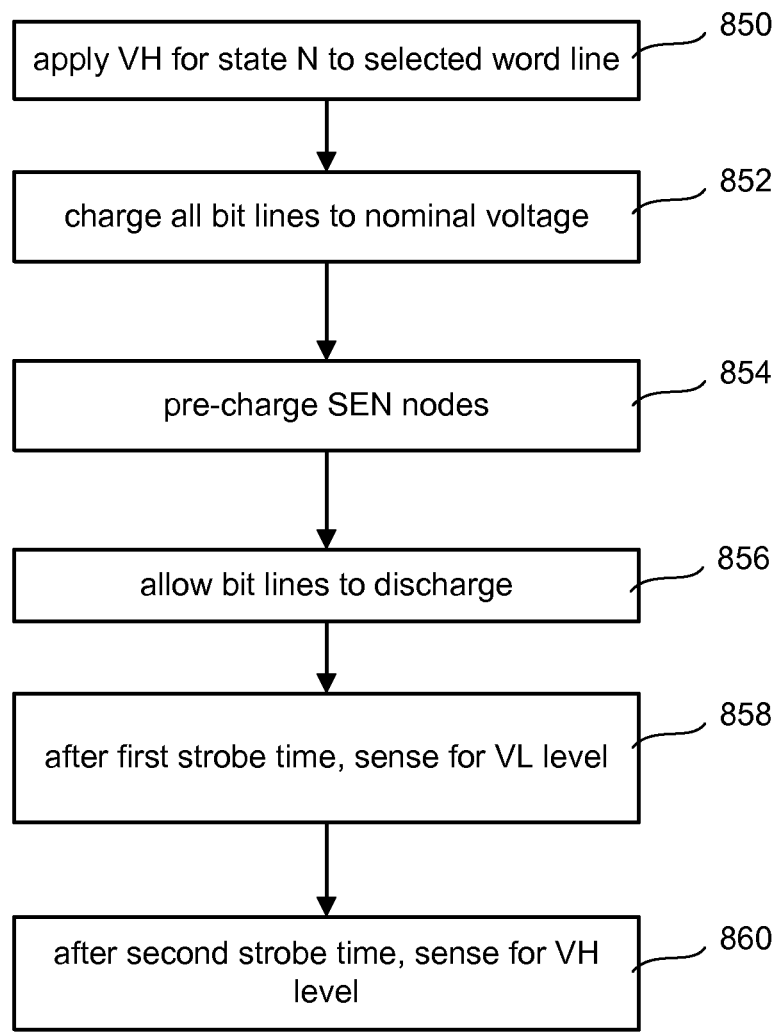
FIG. 24 is a flow chart describing a single strobe sensing operation using multiple strobe times.

FIG. 24 is a flow chart describing a single strobe sensing operation that can be performed for sensing at each of the target data states during a program verification operation. At step 850, the appropriate data state N verify reference voltage VH is applied is applied to the selected word line. At step 852, all bit lines are charged to the nominal bit line voltage (e.g., 0.7 volts). At step 854, the SEN nodes of the sense amplifiers are simultaneously pre-charged, as discussed above. At step 856, the capacitors at the SEN nodes discharge through the memory cells (see capacitor 516 at t5-t6 of FIG. 6), as discussed above. At step 858, after the first strobe time, the voltage of the capacitor 516 (or the SEN node) is sampled as described above to see whether the memory cell(s) conducted so that the memory cells are sensed for VL of state N. At step 860, after the second strobe time (which is longer than the first strobe time), the voltage of the capacitor 516 (or the SEN node) is sampled again to see whether the memory cell(s) conducted so that the memory cells are sensed for VH of state N. The respective SEN nodes and capacitors 516 are charged at the same time and discharged concurrently. The term "concurrently" is used to indicate that the multiple actions occur at overlapping times, for example, they start at the same time but may end at different times.

Accordingly, an apparatus is described that includes a plurality of bit lines, a plurality of word lines, and a plurality of memory cells coupled to the plurality of bit lines and a first word line of the plurality of word lines. The plurality of memory cells includes a first memory cell coupled to a first bit line of the plurality of bit lines. The apparatus includes one or more control circuits configured to communicate with the first bit line and the first word line. The one or more control circuits are configured to verify the first memory cell for a first verify level for a target data state after applying a first program pulse to the first word line and a first enable voltage to the first bit line. The one or more control circuits are configured in response to the first memory cell passing verification for the first verify level for the target state to apply an inhibit voltage to the first bit line and apply a second program pulse to the first word line. The one or more control circuits are configured after applying the second program pulse to verify the first memory cell for the first verify level for the target data state a second time and to verify the first memory cell for a second verify level for the target data state. The one or more control circuits are configured in response to the first memory cell failing verification for the first verify level for the target data state the second time to apply a third program pulse to the first word line and a second enable voltage to the first bit line. The second enable voltage being higher than the first enable voltage and lower than the inhibit voltage.

A method has been described that includes applying a first program pulse to a first memory cell, verifying the first memory cell for a first verify level for a target data state, and if the first memory cell fails verification for the first verify level for the target data state, repeating the applying the first program pulse and verifying the first memory cell for the first verify level. The method includes if the first memory cell passes verification for the first verify level for the target data state, inhibiting the first memory cell from programming for a second program pulse following the first program pulse. After applying the second program pulse, the method includes verifying the first memory cell again for the first verify level and verifying the first memory cell for a second verify level for the target data state. If the first memory cell fails verification for the first verify level after applying the second program pulse, the method includes applying a third program pulse to the first memory cell with a first bit line voltage If the first memory cell passes verification for the first verify level but not the second verify level, the method includes applying the third program pulse to the first memory cell with a second bit line voltage, the second bit line voltage is higher than the first bit line voltage. If the first memory cell passes verification for the second verify level for the target state, the method includes inhibiting the first memory cell from programming.

An apparatus has been described that includes a plurality of memory cells, and one or more control circuits in communication with the plurality of memory cells. The one or more control circuits are configured to apply a first program pulse to a first memory cell and to store for the first memory cell a result based on sensing at a first verify level for a target data state and sensing at a second verify level for the target data state after applying the first program pulse. The first verify level for the target data state is lower in magnitude than the second verify level for the target data state. The one or more control circuits are configured to inhibit programming of the first memory cell for a second program pulse in response to the result of sensing at the first verify level or the result of sensing at the second verify level after the first program pulse indicating a pass condition. The one or more control circuits configured to store for the first memory cell a result of sensing at the first verify level and a result of sensing at the second verify level after applying the second program pulse while inhibiting programming of the first memory cell.

What is claimed is:

1. An apparatus, comprising:
a plurality of bit lines;
a plurality of word lines;
a plurality of memory cells coupled to the plurality of bit lines and a first word line of the plurality of word lines, the plurality of memory cells including a first memory cell coupled to a first bit line of the plurality of bit lines; and
one or more control circuits configured to verify the first memory cell for a first verify level for a target data state after applying a first program pulse to the first word line and a first enable voltage to the first bit line, the one or more control circuits configured in response to the first memory cell passing verification for the first verify level to apply an inhibit voltage to the first bit line and apply a second program pulse to the first word line, the one or more control circuits configured to verify the first memory cell for second verify level for the target data state after applying the second program pulse, the one or more control circuits configured to permanently lockout the first memory cell from programming for the target data state in response to the first memory cell passing verification for the second verify level for the target data state after the second program pulse, the first verify level is lower than the second verify level.

2. The apparatus of claim 1, wherein:
the one or more control circuits are configured to verify the first memory cell for the first verify level for the target data state after applying the second program pulse;
the one or more control circuits are configured to apply a third program pulse to the first word line and a second enable voltage to the first bit line in response to the first memory cell failing verification for the first verify level after the second program pulse, the second enable voltage is higher than the first enable voltage and lower than the inhibit voltage; and
the one or more control circuits are configured to apply the third program pulse to the first word line and a third enable voltage to the first bit line in response to the first memory cell passing verification for the first verify level and failing verification for the second verify level after the second program pulse, the third enable voltage is higher than the second enable voltage and lower than the inhibit voltage.

3. The apparatus of claim 2, wherein:
the first enable voltage enables a first rate of programming of the first memory cell;
the second enable voltage enables a second rate of programming of the first memory cell that is less than the first rate of programming; and
the third enable voltage enables a third rate of programming that is less than the second rate of programming.

4. The apparatus of claim 3, wherein:
the one or more control circuits are configured to apply the third program pulse to the first word line and the inhibit voltage to the first bit line in response to the first memory cell passing verification for the first verify level and passing verification for the second verify level after the second program pulse.

5. The apparatus of claim 1, wherein:
the one or more control circuits are configured to verify the first memory cell for the second verify level for the target state after applying the first program pulse;
the one or more control circuits are configured in response to the first memory cell passing verification for the first verify level and passing verification for the second verify level after the first program pulse:
to apply the inhibit voltage to the first bit line and apply the second program pulse to the first word line; and
after applying the second program pulse, to verify the first memory cell for the first verify level and the second verify level.

6. The apparatus of claim 1, further comprising:
one or more data latches coupled to the one or more control circuits;
wherein the one or more control circuits are configured to store in the one or more data latches a result of sensing at the first verify level and a result of sensing at the second verify level.

7. The apparatus of claim 1, further comprising:
a three-dimensional non-volatile NAND memory array including the plurality of memory cells.

8. The apparatus of claim 1, wherein:
the one or more control circuits are configured to verify the first memory cell for the first verify level for the target data state by applying a reference voltage to the first word line and sensing in response to the reference voltage after a first strobe time; and
the one or more control circuits are configured to verify the first memory cell for the second verify level for the target data state by applying the reference voltage to the first word line and sensing in response to the reference voltage after a second strobe time;
the first strobe time and the second strobe time are different and overlap.

9. A method, comprising:
applying a first program pulse to a first memory cell;
verifying the first memory cell for a first verify level and a second verify level for a target data state, the first verify level is lower than the second verify level;
if the first memory cell fails verification for the first verify level for the target data state, applying a second programming pulse and verifying the first memory cell for the first verify level and the second verify level;
if the first memory cell passes verification for the first verify level and fails verification for the second verify level for the target data state, inhibiting the first memory cell from programming for the second program pulse following the first program pulse;
after applying the second program pulse, verifying the first memory cell for the second verify level for the target data state;
if the first memory cell fails verification for the second verify level after applying the second program pulse, enabling the first memory cell for programming for a third program pulse;
and
if the first memory cell passes verification for the second verify level for the target state, inhibiting the first memory cell from programming for the third program pulse.

10. The method of claim 9, further comprising subsequent to applying the first program pulse and prior to applying the second program pulse:

storing a result of verifying the first memory cell for the first verify level; and storing a result of verifying the first memory cell for the second verify level.

11. The method of claim 10, wherein:

verifying the first memory cell for the first verify level comprises applying a reference voltage to a word line connected to the first memory cell, applying a first bit line voltage to a bit line connected to the first memory cell and sensing in response to the reference voltage and first bit line voltage; and verifying the first memory cell for the second verify level comprises applying the reference voltage to the word line connected to the first memory cell, applying a second bit line voltage to the bit line connected to the first memory cell, and sensing in response to the reference voltage and second bit line voltage.

12. The method of claim 9, further comprising:

inhibiting the first memory cell from programming for the second program pulse in response to the first memory cell passing verification for the first verify level and passing verification for the second verify level; and verifying the first memory cell for the first verify level and the second verify level after applying the second program pulse in response to the first memory cell passing verification for the first verify level and passing verification for the second verify level after applying the first program pulse.

13. The method of claim 9, wherein:

if the first memory cell fails verification for the first verify level and the second verify level after applying the second program pulse, enabling the first memory cell for programming for the third program pulse comprises applying a first bit line voltage;

if the first memory cell passes verification for the first verify level but not the second verify level after applying the second program pulse, enabling the first memory cell for programming for the third program pulse comprises applying a second bit line voltage, the second bit line voltage is higher than the first bit line voltage;

inhibiting the first memory cell from programming includes applying a third bit line voltage, the third bit line voltage is higher than the second bit line voltage; and applying the first program pulse includes applying a fourth bit line voltage, the fourth bit line voltage is lower than the first bit line voltage.

14. The method of claim 13, wherein:

applying the first program pulse to the first memory cell with the fourth bit line voltage enables programming of the first memory cell at a first programming rate;

applying the third program pulse to the first memory cell with the first bit line voltage enables programming of the first memory cell at a second programming rate, the second programming rate is less than the first programming rate; and applying the third program pulse to the first memory cell with the second bit line voltage enables programming of the first memory cell at a third programming rate, the third programming rate is less than the second programming rate.

15. An apparatus, comprising:

a plurality of memory cells; and one or more control circuits in communication with the plurality of memory cells, the one or more control circuits configured to apply a first program pulse to a first memory cell, the one or more control circuits configured to store for the first memory cell a result based on sensing at a first verify level for a target data state and sensing at a second verify level for the target data state after applying the first program pulse, wherein the first verify level for the target data state is lower in magnitude than the second verify level for the target data state, the one or more control circuits configured to inhibit programming of the first memory cell for a second program pulse in response to the result of sensing at the first verify level after the first program pulse indicating a pass condition, the one or more control circuits configured to inhibit programming of the first memory cell for the second program pulse in response to the result of sensing at the second verify level after the first program pulse indicating a pass condition, the one or more control circuits configured to store for the first memory cell a result of sensing at the second verify level after applying the second program pulse while inhibiting programming of the first memory cell, wherein:

the one or more control circuits are configured to sense the first memory cell for the first verify level for the target data state by applying a reference voltage to a first word line connected to the first memory cell and sensing in response to the reference voltage after a first strobe time;

the one or more control circuits are configured to sense the first memory cell for the second verify level for the target data state by applying the reference voltage to the first word line and sensing in response to the reference voltage after a second strobe time; and the first strobe time and the second strobe time are different and overlap.

16. The apparatus of claim 15, wherein:

the one or more control circuits apply the first program pulse while enabling a first rate of programming for the first memory cell;

the one or more control circuits are configured to, in response to the result of sensing at the first verify level indicating a failure condition after the second program pulse, apply a third program pulse while applying a first bit line voltage for the first memory cell; and the first bit line voltage enables a second rate of programming for the first memory cell that is less than the first rate of programming.

17. The apparatus of claim 15, wherein:

the one or more control circuits are configured to store for the first memory cell a result of sensing at the first verify level after applying the second program pulse while inhibiting programming of the first memory cell.

18. An apparatus, comprising:

a plurality of memory cells; and one or more control circuits in communication with the plurality of memory cells, the one or more control circuits configured to apply a first program pulse to a first memory cell, the one or more control circuits configured to store for the first memory cell a result based on sensing at a first verify level for a target data state and sensing at a second verify level for the target data state after applying the first program pulse, wherein the first verify level for the target data state is lower in magnitude than the second verify level for the target data state, the one or more control circuits configured to inhibit programming of the first memory cell for a second program pulse in response to the result of sensing at the first verify level after the first program pulse indicating a pass condition, the one or more control circuits configured to inhibit programming of the first memory cell for the second program pulse in response to the result of sensing at the second verify level after the first program pulse indicating a pass condition, the one or more control circuits configured to store for the first memory cell a result of sensing at the second verify level after applying the second program pulse while inhibiting programming of the first memory cell, wherein:

the one or more control circuits apply the first program pulse while enabling a first rate of programming for the first memory cell;

the one or more control circuits are configured to, in response to the result of sensing at the first verify level indicating a failure condition after the second program pulse, apply a third program pulse while applying a first bit line voltage for the first memory cell;

the first bit line voltage enables a second rate of programming for the first memory cell that is less than the first rate of programming;

the one or more control circuits are configured to, in response to the result of sensing at the first verify level indicating the pass condition after the second program pulse and the result of sensing at the second verify level indicating the failure condition after the second program pulse, apply the third program pulse while applying a second bit line voltage for the first memory cell; and the second bit line voltage is higher than the first bit line voltage and enables a third rate of programming for the first memory cell that is less than the second rate of programming.

19. The apparatus of claim 18, wherein:

the one or more control circuits are configured to, in response to the result of sensing at the second verify level indicating the pass condition after the second program pulse, apply the third program pulse while applying a third bit line voltage for the first memory cell; and the third bit line voltage is higher than the second bit line voltage and inhibits the first memory cell from being programmed during the third program pulse.

20. The apparatus of claim 18, wherein:

the one or more control circuits are configured to store for the first memory cell a result of sensing at the first verify level after applying the second program pulse while inhibiting programming of the first memory cell.

* * * * *